(12) United States Patent
Lee et al.

US011269252B2

(10) Patent No.: US 11,269,252 B2
(45) Date of Patent: Mar. 8, 2022

(54) METHOD FOR FORMING PATTERN USING ANTIREFLECTIVE COATING COMPOSITION INCLUDING PHOTOACID GENERATOR

(71) Applicants: ROHM AND HAAS ELECTRONIC MATERIALS KOREA LTD., Cheonan-si (KR); ROHM AND HAAS ELECTRONIC MATERIALS LLC, Marlborough, MA (US)

(72) Inventors: Jung-June Lee, Cheonan-si (KR); Jae-Yun Ahn, Cheonan-si (KR); Jae-Hwan Sim, Cheonan-si (KR); Jae-Bong Lim, Cheonan-si (KR); Emad Aqad, Northborough, MA (US); Myung-Yeol Kim, Hwaseong-si (KR)

(73) Assignees: ROHM AND HAAS ELECTRONIC MATERIALS LLC, Marlborough, MA (US); ROHM AND HAAS ELECTRONIC MATERIALS KOREA LTD., Cheonan-si (KR)

(*) Notice: Subject to any disclaimer, the term of this patent is extended or adjusted under 35 U.S.C. 154(b) by 0 days.

(21) Appl. No.: 16/517,950

(22) Filed: Jul. 22, 2019

(65) Prior Publication Data
US 2021/0026242 A1    Jan. 28, 2021

(51) Int. Cl.
| | | |
|---|---|---|
| *G03F 7/004* | (2006.01) | |
| *G03F 7/09* | (2006.01) | |
| *G03F 7/00* | (2006.01) | |
| *C08G 12/42* | (2006.01) | |

(52) U.S. Cl.
CPC ......... *G03F 7/0045* (2013.01); *C08G 12/427* (2013.01); *G03F 7/0035* (2013.01); *G03F 7/091* (2013.01)

(58) Field of Classification Search
CPC ...... G03F 7/0045; G03F 7/091; G03F 7/0035; C08G 12/427
USPC ........................................................ 430/270.1
See application file for complete search history.

(56) References Cited

U.S. PATENT DOCUMENTS

| | | | |
|---|---|---|---|
| 5,851,730 A | 12/1998 | Thackeray et al. | |
| 5,851,738 A | 12/1998 | Thackeray et al. | |
| 5,886,102 A | 3/1999 | Sinta et al. | |
| 5,939,236 A | 8/1999 | Pavelcheck et al. | |
| 6,261,743 B1 | 7/2001 | Pavelchek et al. | |
| 9,146,467 B2 | 9/2015 | Houlihan et al. | |
| 2003/0098464 A1* | 5/2003 | Kon | G03F 7/0045 257/194 |
| 2010/0119972 A1 | 5/2010 | Houlihan et al. | |
| 2011/0033801 A1 | 2/2011 | Zampini et al. | |
| 2015/0185614 A1* | 7/2015 | Sim | C09D 179/08 430/324 |
| 2016/0187781 A1* | 6/2016 | Kang | G03F 7/2041 430/325 |
| 2018/0095367 A1* | 4/2018 | Ryu | C08G 73/0273 |
| 2019/0085173 A1 | 3/2019 | Lee et al. | |
| 2019/0129305 A1 | 5/2019 | Lee et al. | |

FOREIGN PATENT DOCUMENTS

| | | |
|---|---|---|
| JP | 2015129938 A | 7/2015 |
| KR | 20150077949 A | 7/2015 |

* cited by examiner

*Primary Examiner* — Caleen O Sullivan
(74) *Attorney, Agent, or Firm* — Cantor Colburn LLP

(57) ABSTRACT

An antireflective coating composition, including a polymer, a photoacid generator having a crosslinkable group, a compound capable of crosslinking the polymer and the photoacid generator, a thermal acid generator, and an organic solvent.

32 Claims, No Drawings

METHOD FOR FORMING PATTERN USING ANTIREFLECTIVE COATING COMPOSITION INCLUDING PHOTOACID GENERATOR

FIELD

The present disclosure generally relates to antireflective coating compositions for use with photoresist applications. Specifically, the disclosure provides antireflective compositions for improving a pattern collapse margin in negative tone development.

BACKGROUND

A photoresist is a photosensitive composition which is used to transfer an image to a substrate. A coating layer of the photoresist is formed on the substrate, and then exposed to actinic radiation through a photomask. The photomask has regions which are opaque and transparent to actinic radiation. When the photoresist coating layer is exposed to the actinic radiation, light-inducible chemical modification occurs on the photoresist coating layer. As a result, a pattern of the photomask is transferred to the photoresist coating layer. Thereafter, the photoresist coating layer is developed to form a patterned image to be capable of being selectively treated on a substrate.

Typically, a chemically amplified negative-tone photoresist includes a resin having an acid-labile leaving group and a photoacid generator (PAG). When such photoresist is exposed to chemical radiation rays, the photoacid generator forms an acid, and the acid thus formed causes the acid-labile group to detach from the resin during the post-exposure bake process. The removal of the acid-labile group creates differences in solubility characteristics towards an aqueous alkaline developer or a hydrophobic organic solvent-based developer between the exposed area and non-exposure area. The exposure area of a resist renders soluble in aqueous alkaline developers, and insoluble in hydrophobic organic solvent-based developers. In the manufacturing process of a semiconductor device, a positive tone process employs an aqueous alkaline developer and leaves only non-exposed area of the photoresist on the substrate; whereas a negative tone process employs a hydrophobic organic solvent-based developer and leaves only exposed area of the photoresist on the substrate.

Generally, photoresists are used to print micro or nano scale patterns on a semiconductor substrate, such as Si or GaAs, which are converted into a composite matrix of an electronic conduction path (preferably micron or submicron geometry) for performing circuit functions. To achieve such objects, the details of photoresist treatment and processing conditions are very important. Several operations used to treat the photoresist act interdependently, but one of the most important operations to obtain a high-resolution photoresist image is the radiation exposure step.

In such a light exposure operation, the reflected radiation from the photoresist coating layer degrades the resolution of the patterned feature. For example, when the exposure radiation is reflected on an interface between the substrate and the photoresist, a spatial variation in intensity of the radiation radiated to the photoresist coating layer occurs, and the radiation is scattered toward the intentionally unexposed photoresist region. Therefore, radiation reflection upon photoresist exposure leads to a lack of pattern uniformity in upon development, such as non-uniform line width in printed line-space features. In addition, since there are differences in quantities of scattered or reflected radiation between the regions, the resolution may be become sensitive to the substrate topography.

To solve the reflection-related problems described above, an additional light absorption layer, that is, an antireflective coating layer, is coated between the surface of the substrate and the photoresist coating layer (see U.S. Pat. Nos. 5,939,236, 5,886,102, 5,851,738, 5,851,730, etc.).

In the case of such conventional antireflective coating layers, however, negative tone development (NTD) in a photolithographic process frequently suffers from pattern collapse when the pattern has a small critical dimension (40 nm or less). This phenomenon has caused deterioration in product quality, as well as low yields due to considerable difficulty in securing a process margin.

Recently, a pattern collapse margin (PCM) in NTD process has become the most critical issue for higher yield in the ArF immersion lithography with reduced pattern scale. The PCM in NTD is significantly dependent on the properties of the bottom antireflective coating (BARC) film. Particularly, acidic BARC surface can strongly enhance pattern collapse by further increase deprotection reaction of the photoresist. As acidic catalyst in BARC, photoacid generator can be one of the good acidity control units in a BARC formulation, as it can improve the pattern collapse by generated acid only at exposed area. However, the main disadvantages of this method are decrease of PAG concentration on the BARC surface during photoresist spin-coating or reducing resist consumption (RRC) process, due to dissolving out by the process solvent. There remains a need for new antireflective coating compositions capable of improving a pattern collapse margin in negative tone development.

SUMMARY

An embodiment provides an antireflective coating composition, including a polymer, a photoacid generator having a crosslinkable group, a compound capable of crosslinking the polymer and the photoacid generator, a thermal acid generator, and an organic solvent.

Another embodiment provides a coated substrate, including (a) a substrate; and (b) a layer of a antireflective coating composition disposed over the substrate.

Yet another embodiment provides a method of forming a pattern, including:

(a) applying a layer of the antireflective coating composition on a substrate;

(b) curing the applied antireflective coating composition to form an antireflective layer;

(c) forming a photoresist layer over the antireflective layer; and (d) patterning the photoresist layer and transferring the pattern from the patterned photoresist layer to the antireflective layer.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "hydrocarbon group" refers to an organic compound having at least one carbon atom and at least one hydrogen atom, optionally substituted with one or more substituents where indicated.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "hydroxyalkyl group" refers to an alkyl group substituted with at least one hydroxyl group (—OH).

As used herein, when a definition is not otherwise provided, the term "alkoxy group" refers to "alkyl—O—", wherein the term "alkyl" has the same meaning as "alkyl group" described above.

As used herein, when a definition is not otherwise provided, the term "carboxylic acid group" refers to a group having the formula "—C(=O)—OH".

As used herein, when a definition is not otherwise provided, the term "cycloalkyl group" refers to a monovalent group having one or more saturated rings in which all ring members are carbon.

As used herein, when a definition is not otherwise provided, the term "alkenyl group" refers to a straight or branched chain, monovalent hydrocarbon group having at least one carbon-carbon double bond.

As used herein, when a definition is not otherwise provided, the term "aryl group", which is used alone or in combination, refers to an aromatic or heteroaromatic hydrocarbon containing at least one ring and having the specified number of carbon atoms. The term "aryl group" may be construed as including a group with an aromatic or heteroaromatic ring fused to at least one cycloalkyl or heterocycloalkyl ring. The "aryl" group may include one or more heteroatom(s) independently selected from nitrogen (N), oxygen (O), P (phosphorus), and sulfur (S).

As used herein, when a definition is not otherwise provided, the term "aryloxy group" refers to "aryl—O—", wherein the term "aryl" has the same meaning as "aryl group" described above.

As noted above, a pattern collapse margin (PCM) in negative tone development (NTD) is significantly dependent on properties of the bottom antireflective coating (BARC) film. Particularly, the acidic BARC surface can strongly enhance pattern collapse by a deprotection reaction of the photoresist. A photoacid generator, as a precursor for the acidic catalyst, can be one of the good acidity control units in a BARC formulation, as it can improve the pattern collapse by generated acid at the exposed areas. However, the PAG concentration on the BARC surface during photoresist spin-coating gets decreased because some part of PAG are rinsed out by the process solvent.

The present inventors have found that implementation of crosslinkable PAG in the antireflective composition can provide reduced loss of PAG on the BARC surface by a crosslinked reaction with BARC polymer during the polymer baking step, and that the furnished antireflective layer exhibits much improved pattern collapse by effectively generated strong acid from the crosslinked PAG in the exposed BARC areas.

Accordingly, an embodiment of the present invention provides an antireflective coating composition, including a polymer, a photoacid generator having a crosslinkable group, a compound capable of crosslinking the polymer and the photoacid generator, a thermal acid generator, and an organic solvent.

The antireflective composition includes a photoacid generator having a crosslinkable group. As used herein, the term "crosslinkable group" refers to any reactive group capable of crosslinking the photoacid generator to the polymer. The crosslinkable group may be an unsaturated functional group such as a carbon-carbon double bond or a carbon-carbon triple bond capable of reacting by a radical mechanism. The crosslinkable group may also be a functionality containing a heteroatom such as nitrogen, oxygen, phosphorus, sulfur, or a halogen. For example, the crosslinkable group may be a hydroxyl group, an alkoxy group, an amino group (which may be unsubstituted or substituted with at least one alkyl group or at least one aryl group), a thiol group, a thioether group, a carbonyl group that is present in aldehydes and ketones, a carboxylic acid group or a salt thereof, a phosphoric acid group or a salt thereof, a sulfonic acid group or a salt thereof, a carboxylic acid ester group, an amide group which may be unsubstituted or substituted with at least one alkyl group or at least one aryl group, a sulfonic acid ester group, or a phosphoric acid ester group, but is not limited thereto. In an embodiment, the crosslinkable group may be a hydroxyl group.

The crosslinkable photoacid generator may be an onium photoacid generator, such as a sulfonium salt or an iodonium salt, each including a cation portion and an anion portion. A crosslinkable group can be included either in the cation portion or an anion portion of the onium salt. When the onium salt include an aromatic group, the crosslinkable group can be attached to the aromatic group either directly or indirectly.

In an embodiment, the photoacid generator may be an onium salt having formula G+A wherein G+ may have Formula 1 and $A^-$ may be a non-polymerizable organic anion:

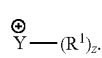

Formula 1

In Formula 1, z may be 2 or 3, wherein when Y is I, z is 2, or when Y is S, z is 3.

Each $R^1$ in Formula 1 may be independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein when X is S, one of the $R^1$ may be optionally attached to one adjacent $R^1$ by a single bond or a linking group. At least one $R^1$ in Formula 1 is a polycyclic or monocyclic $C_{6-30}$ aryl group bearing a hydroxyl group attached thereto directly (through a single bond) or indirectly (through an unsubstituted or substituted $C_1$-$C_{30}$ linking group optionally including at least one heteroatom selected from O, S, N, and P).

In an example, G+ may be represented by Formula 2:

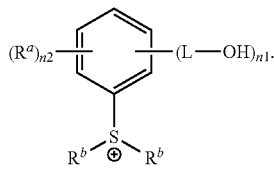

Formula 2

In Formula 2,
each $R^a$ may independently be hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C3_{60}$ arylthio group, a substituted or unsubstituted $C_7$-$C_{30}$ arylalkyl group, each $R^b$ may independently be a substituted or unsubstituted $C_{1-30}$ alkyl group, a substituted or unsubstituted polycyclic or monocyclic $C_{3-30}$ cycloalkyl group, or unsubstituted polycyclic or monocyclic $C_{6-30}$ aryl group, wherein groups $R^b$ may be optionally attached to each other by a single bond or a linking group, each L may be a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —$CH_2$-group is optionally replaced by —$SO_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

n1 is an integer from 1 to 5, and
n2 is an integer from 0 to 4,
provided that the sum of n1 and n2 does not exceed 5.
In another example, G+ may be represented by Formula 3:

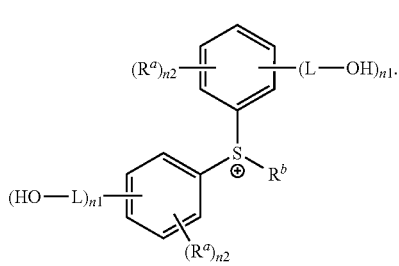

Formula 3

In Formula 3,
each $R^a$ may independently be hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C3_{60}$ arylthio group, a substituted or unsubstituted $C_7$-$C_{30}$ arylalkyl group, wherein groups $R^a$ are optionally attached to each other by a single bond or a linking group, $R^b$ may be a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, each L may be a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —$CH_2$-group is optionally replaced by —$SO_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 may be an integer from 1 to 5, and
each n2 may be an integer from 0 to 4,
provided that each sum of n1 and n2 does not exceed 5.

In yet another example, G⁺ may be represented by Formula 4:

Formula 4

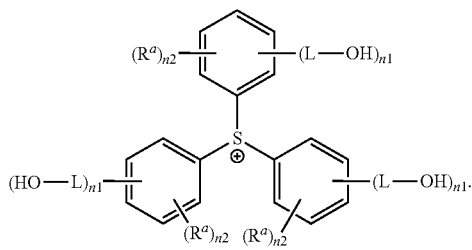

In Formula 4, each $R^a$ may be hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C3_{60}$ arylthio group, a substituted or unsubstituted $C_7$-$C_{30}$ arylalkyl group, each L may be a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH₂— group is optionally replaced by —SO₂—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 may be an integer from 1 to 5, and each n2 may be an integer from 0 to 4, provided that each sum of n1 and n2 does not exceed 5.

The non-polymerizable organic anion A⁻ may be a sulfonate anion. For example, A⁻ may be a non-fluorinated sulfonate anion, a partially fluorinated sulfonate anion, or a fully fluorinated sulfonate anion. In an embodiment, A⁻ may be represented by the formula R—SO₃⁻, wherein R is a linear or branched C1-C30 alkyl group or a linear or branched C1-C30 heteroalkyl group, each of which may optionally include at least one fluorine atom.

In another embodiment, A⁻ may be represented by Formula 8:

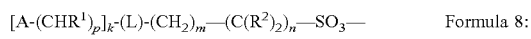

[A-(CHR¹)ₚ]ₖ-(L)-(CH₂)ₘ—(C(R²)₂)ₙ—SO₃—  Formula 8:

wherein, in Formula 8,

A is a substituted or unsubstituted, monocyclic, polycyclic, or fused polycyclic $C_5$ or greater cycloaliphatic group optionally including O, S, N, F, or a combination including at least one of the foregoing, $R^1$ is H, a single bond, or a substituted or unsubstituted $C_{1-30}$ alkyl group, wherein when $R^1$ is a single bond, $R^1$ is covalently bonded to a carbon atom of A, each $R^2$ is independently H, F, or $C_{1-4}$ fluoroalkyl, wherein at least one $R^2$ is not hydrogen, L is a linking group including a sulfonate group, a sulfonamide group, or a $C_{1-30}$ sulfonate or sulfonamide-containing group, and p is an integer of 0 to 10, k is 1 or 2, m is an integer of 0 or greater, and n is an integer of 1 or greater.

In some embodiments, the crosslinkable photoacid generator may be represented by one of the following formulae (PA-1) to (PA-32:

PA-1

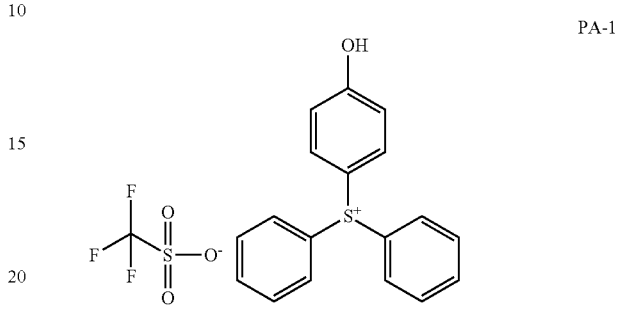

PA-2

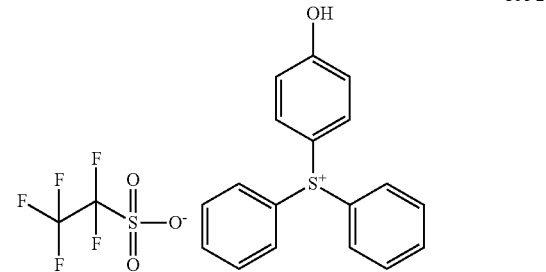

PA-3

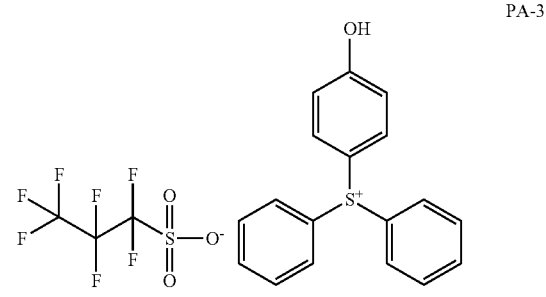

PA-4

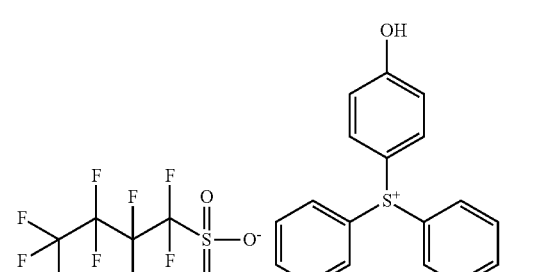

PA-5

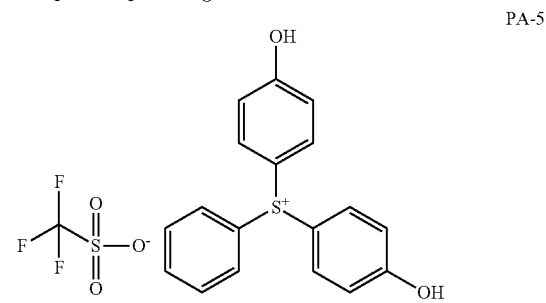

PA-6
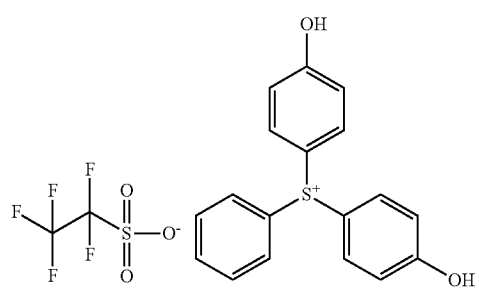
PA-7
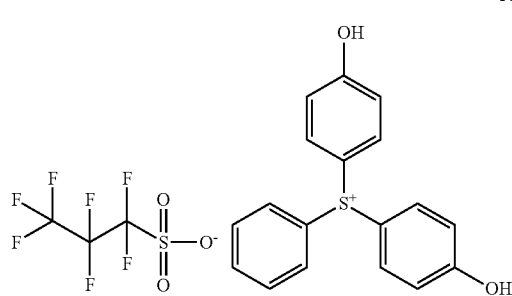
PA-8
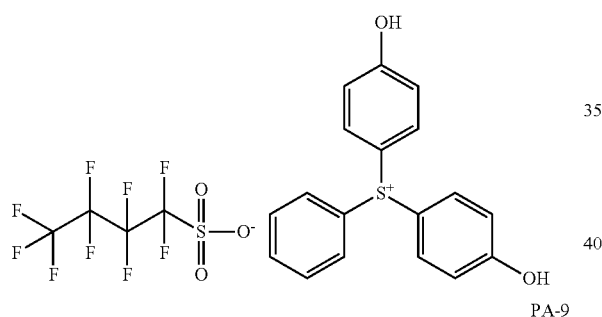
PA-9
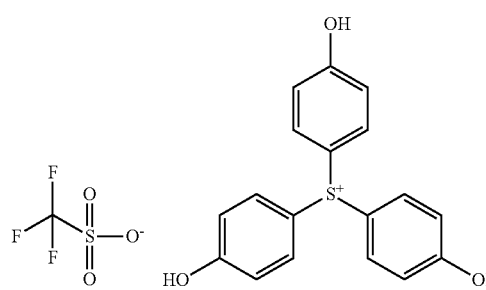
PA-10
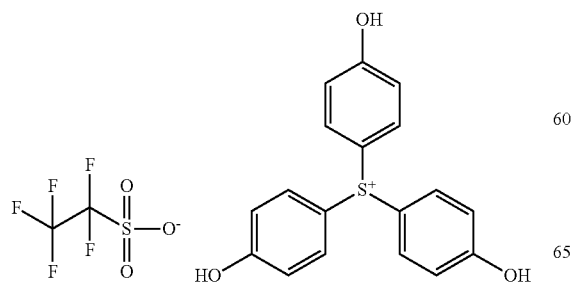
PA-11
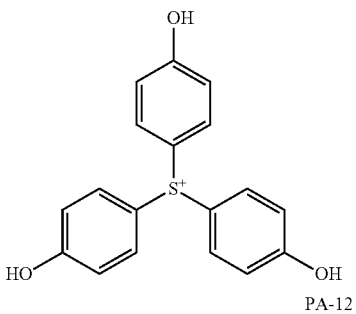
PA-12
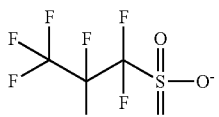
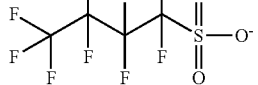
PA-13
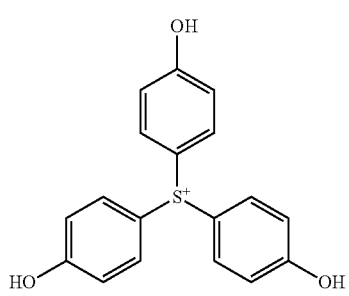
PA-14
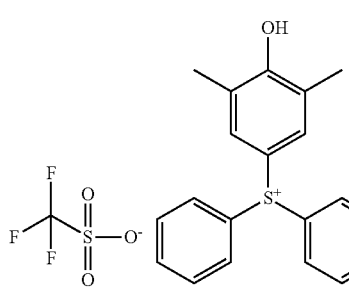
PA-15
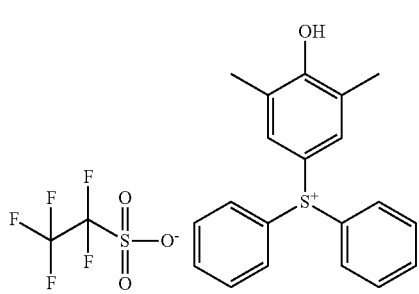

PA-16
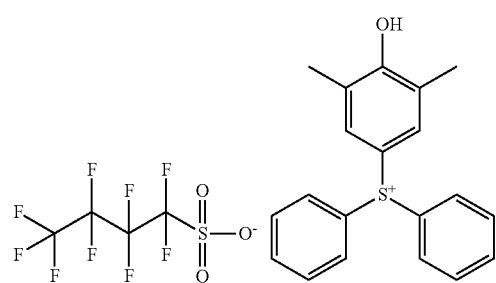
PA-17
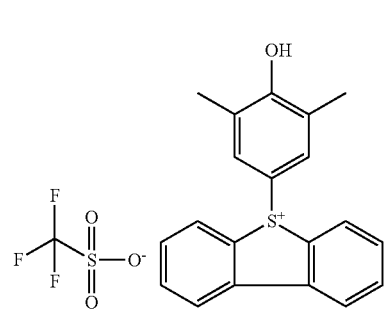
PA-18
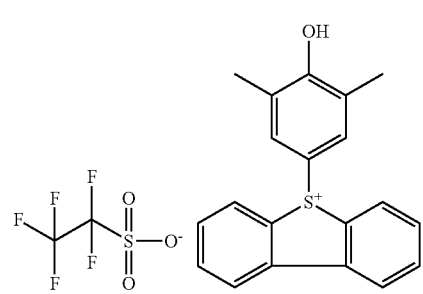
PA-19
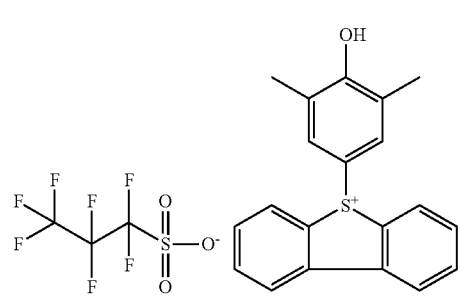
PA-20
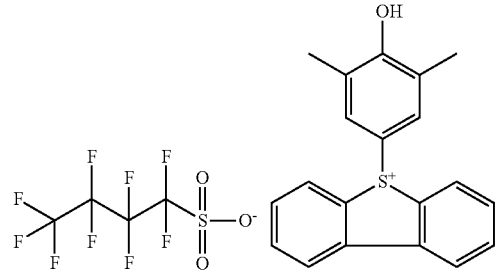
PA-21
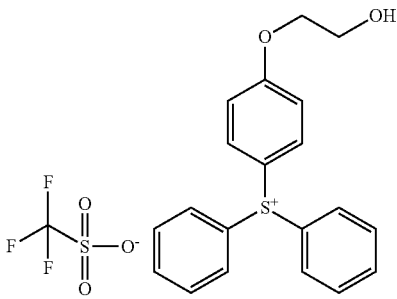
PA-22
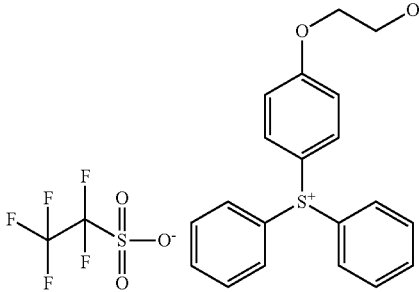
PA-23
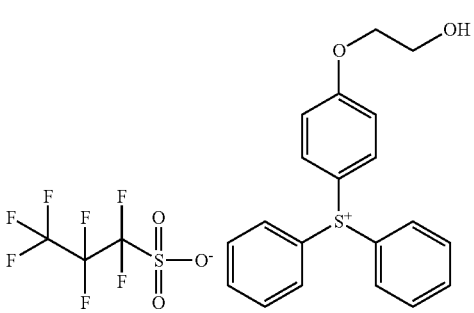
PA-24
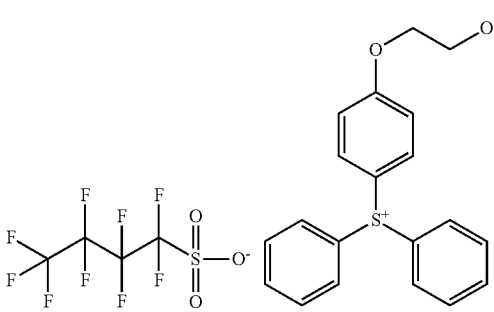
PA-25
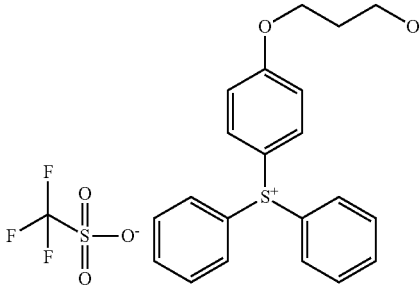

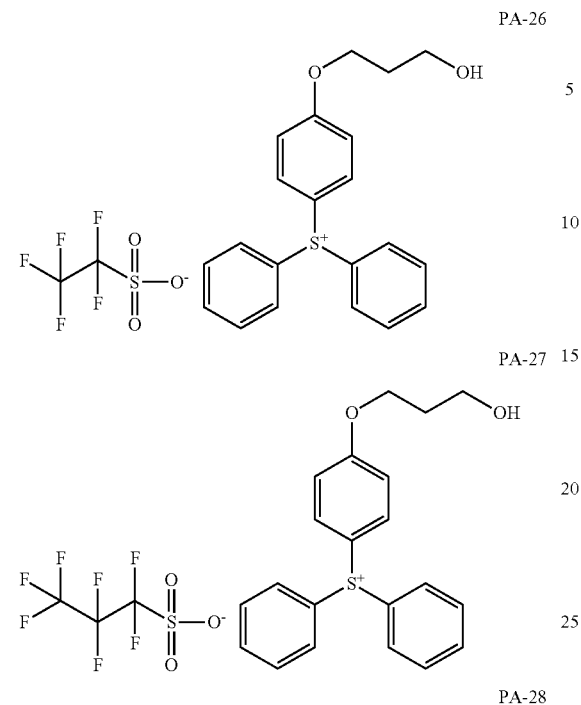

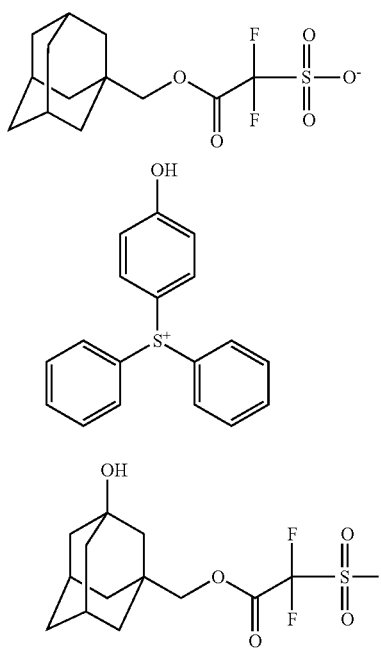

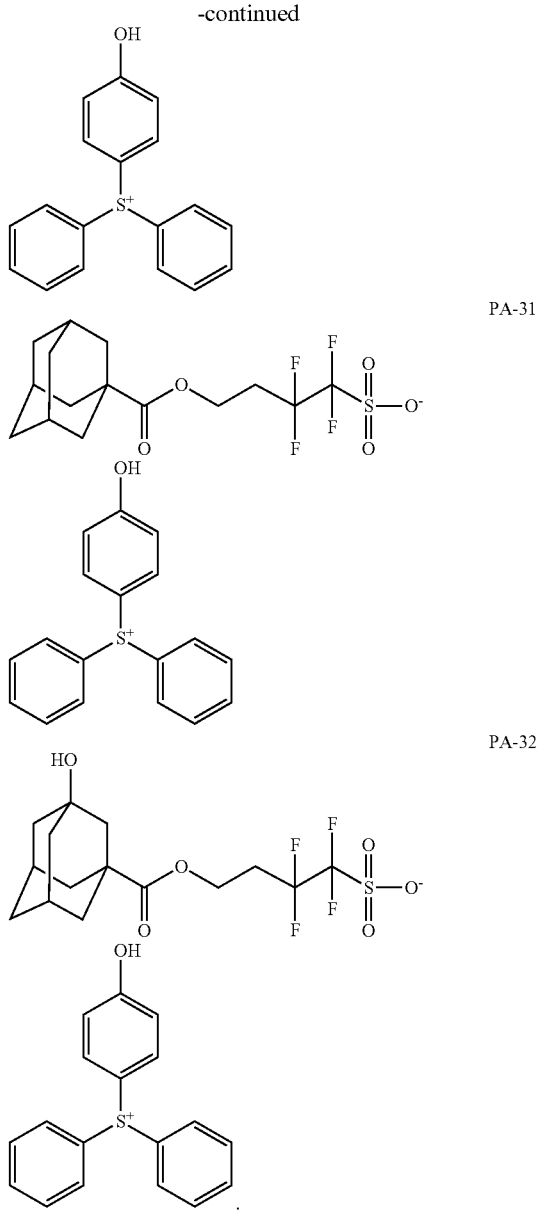

The amount of the crosslinkable photoacid generator in the antireflective composition may be from 1 weight % to 15 weight % based on total solids of the antireflective composition. For example, the amount of the crosslinkable photoacid generator in the antireflective composition may be from 1 weight % to 10 weight % based on total solids of the antireflective composition, or from 1 weight % to 5 weight % based on total solids of the antireflective composition, but is not limited thereto.

The antireflective composition further includes a polymer that is capable of crosslinking with the photoacid generator. A polymer may include a cyanurate structural unit that includes substitution of multiple cyanurate nitrogen ring atoms by distinct (different) carboxy (e.g., —COOH) and/or carboxy ester (e.g., —COOR where R is other than hydrogen such as $C_1$-$C_{12}$ alkyl) substitution. The cyanurate structural unit may be derived from a compound represented by Formula 5:

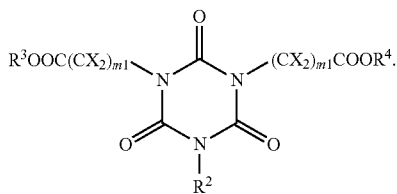

Formula 5

In Formula 5, at least two of $R^3OOC(CX_2)_{m1}-$, $R^2-$, and $R^4OOC(CX_2)._{m1}-$ may represent different acid or ester groups. By stating herein that at least two of the radicals $R^3OOC(CX_2)_{m1}-$, $R^2-$ and $R^3OOC(CX_2)_{m1}-$ are different acid or ester groups, it is meant that at least two radicals will have at least one atom difference. For example, if values of m1 are not equal, then the groups will be different acid or ester groups. If the groups $R^3$ and $R^4$ are not the same (e.g., $R^3$ is $-CH_3$ and $R^4$ is $-H$), then the groups will be different acid or ester groups. If $R^2$ is an acid, and the $R^3$ is other than hydrogen, then the groups are different. In many cases, the radicals will differ by two or more atoms.

In Formula 5, $R^2$, $R^3$, $R^4$, and each X may independently be hydrogen or non-hydrogen substituent such as a substituted or unsubstituted $C_{1-30}$ alkyl group, a substituted or unsubstituted $C_{2-30}$ alkenyl group (such as optionally substituted allyl), a substituted or unsubstituted $C_{2-30}$ alkynyl group (such as optionally substituted propargyl), a substituted or unsubstituted $C_{2-30}$ alkanoyl group (such as optionally substituted acetyl), a substituted or unsubstituted $C_1-C_{30}$ alkoxy group (such as optionally substituted methoxy, propoxy, butoxy), a substituted or unsubstituted $C_1-C_{30}$ alkylthio group, a substituted or unsubstituted $C_1-C_{30}$ alkylsulfinyl group, a substituted or unsubstituted $C_1-C_{30}$ alkylsulfonyl group, $-COOH$, a substituted or unsubstituted $C_2-C_{30}$ alkoxycarbonyl group (including esters that are substantially non-reactive to a photoacid); a substituted or unsubstituted $C_7-C_{30}$ alkylaryl group (such as optionally substituted benzyl), a substituted or unsubstituted $C_6-C_{30}$ aryl (such as optionally substituted phenyl, naphthyl, acenaphthyl), or a substituted or unsubstituted $C_3-C_{30}$ heteroalicyclic or a substituted or unsubstituted $C_3-C_{30}$ heteroaromatic group (such as optionally substituted methylphthalimide, N-methyl-1,8-phthalimide), and each m1 may be the same or different and may be independently an integer of 1 to 10.

In an embodiment, the cyanurate structural unit may be derived from a compound represented by Formula 5a:

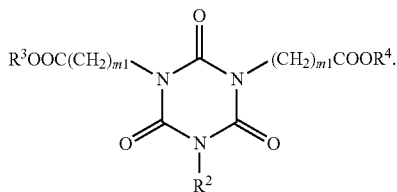

Formula 5a

In Formula 5a, $R^2$, $R^3$, and $R^4$ are the same as those groups described in connection with Formula 5 above.

In Formulae 5 and 5a, $R^2$ may be useful to introduce various functionalities to the polymer, including those to impart desired lithographic properties such as optical properties, etch rates, thermal properties, solubility in coating solvents and coating properties over different substrate surfaces. $R^2$ in the above Formulae 5 and 5a may also influence the polymerization process for obtaining a more linear and higher molecular coating polymer compositions.

The polymer may further include a cyanurate structural unit derived from a compound represented by Formula 6.

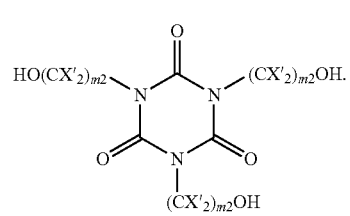

Formula 6

In Formula 6, each X', each X", and each $R^5$ may independently be hydrogen or non-hydrogen substituent such as a substituted or unsubstituted $C_{1-30}$ alkyl group, a substituted or unsubstituted $C_{2-30}$ alkenyl group (such as optionally substituted allyl), a substituted or unsubstituted $C_{2-30}$ alkynyl group (such as optionally substituted propargyl), a substituted or unsubstituted $C_{2-30}$ alkanoyl group (such as optionally substituted acetyl), a substituted or unsubstituted $C_1-C_{30}$ alkoxy group (such as optionally substituted methoxy, propoxy, butoxy), a substituted or unsubstituted $C_1-C_{30}$ alkylthio group, a substituted or unsubstituted $C_1-C_{30}$ alkylsulfinyl group, a substituted or unsubstituted $C_1-C_{30}$ alkylsulfonyl group, a substituted or unsubstituted $C_1-C30$ (alkyl)carboxy group (which includes groups such as $-COOR'$ where R' is H or $C_1-C_{30}$ alkyl, including esters that are substantially non-reactive to a photoacid); a substituted or unsubstituted $C_7-C_{30}$ alkylaryl group (such as optionally substituted benzyl), a substituted or unsubstituted $C_6-C_{30}$ aryl (such as optionally substituted phenyl, naphthyl, acenaphthyl), or a substituted or unsubstituted $C_3-C_{30}$ heteroalicyclic or a substituted or unsubstituted $C_3-C_{30}$ heteroaromatic group (such as optionally substituted methylphthalimide, N-methyl-1,8-phthalimide), and each m2 may be the same or different and each may be a whole number, e.g., 0, 1, 2, 3, or 4, with m2 equal a positive integer such as 1 or 2 being often preferred.

The amount of the polymer in the antireflective composition may be from 75 weight % to 99 weight % based on total solids of the antireflective composition. For example, the amount of the polymer in the antireflective composition may be from 85 weight % to 95 weight % based on total solids of the antireflective composition, but is not limited thereto.

The composition further includes a crosslinkable compound, which is not specifically limited and may be any crosslinking substance that may initiate a crosslinking reaction by light and/or heat. For example, the crosslinkable compound may be a molecule that may initiate a crosslinking reaction by heat. The crosslinkable compound is cured, crosslinked or hardened when a photoacid generator releases an acid upon exposure to an active radiation rays.

In an embodiment, the crosslinkable compound may be represented by Formula 7

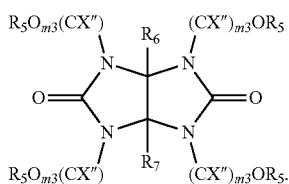

Formula 7

In Formula 7, each X', each X", each $R^5$, $R^6$, and $R^7$ may independently be hydrogen, a halogen, a hydroxyl group, a substituted or unsubstituted $C_{1-30}$ alkyl group, a substituted or unsubstituted $C_1$-$C_{30}$ alkoxy group, a substituted or unsubstituted $C_3$-$C_{30}$ cycloalkyl group, a substituted or unsubstituted $C_7$-$C_{30}$ arylalkyl group, and each m2 and each m3 may independently be an integer of 1 to 10.

The amount of the crosslinkable compound in the antireflective composition may be from 0 weight % to 15 weight % by weight based on total solids of the antireflective composition. For example, the amount of the crosslinkable compound in the antireflective composition may be from 0 weight % to 10 weight % based on total solids of the antireflective composition or from 0 weight % to 5 weight % based on total solids of the antireflective composition, but is not limited thereto.

When the polymer reacts with the crosslinkable compound, a crosslinked polymer is formed. In an embodiment, the crosslinked polymer may include a structural unit derived from a compound represented by Formula 5 and a structural unit derived from a compound represented by Formula 6. In another embodiment, the crosslinked polymer may include a structural unit derived from a compound represented by Formula 5 and a structural unit derived from a compound represented by Formula 7. In yet another embodiment, the crosslinked polymer may include a structural unit derived from a compound represented by Formula 5, a structural unit derived from a compound represented by Formula 6, and a structural unit derived from a compound represented by Formula 7.

The crosslinked polymer may be represented by one of the following formulae (P-A) to (P-R):

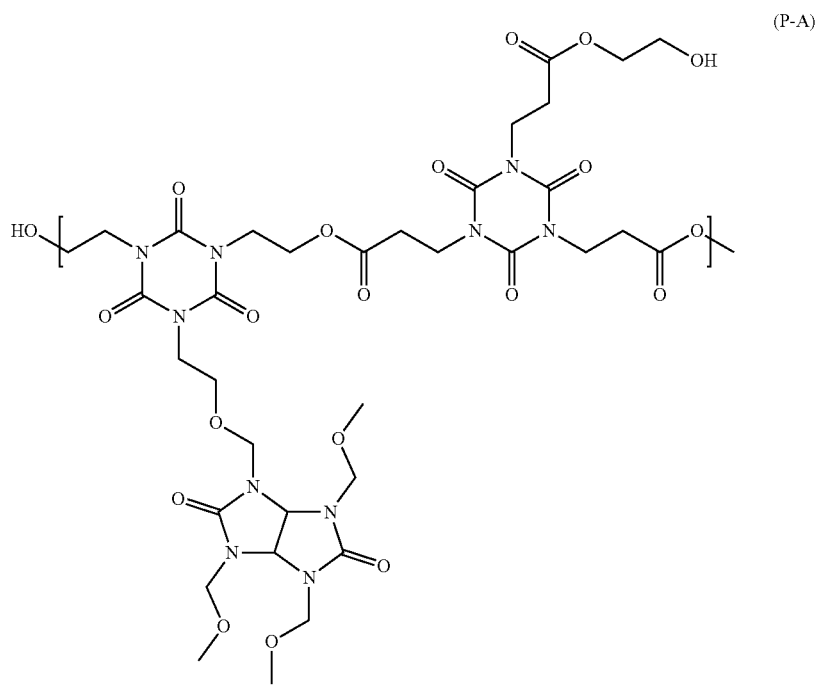

(P-A)

-continued
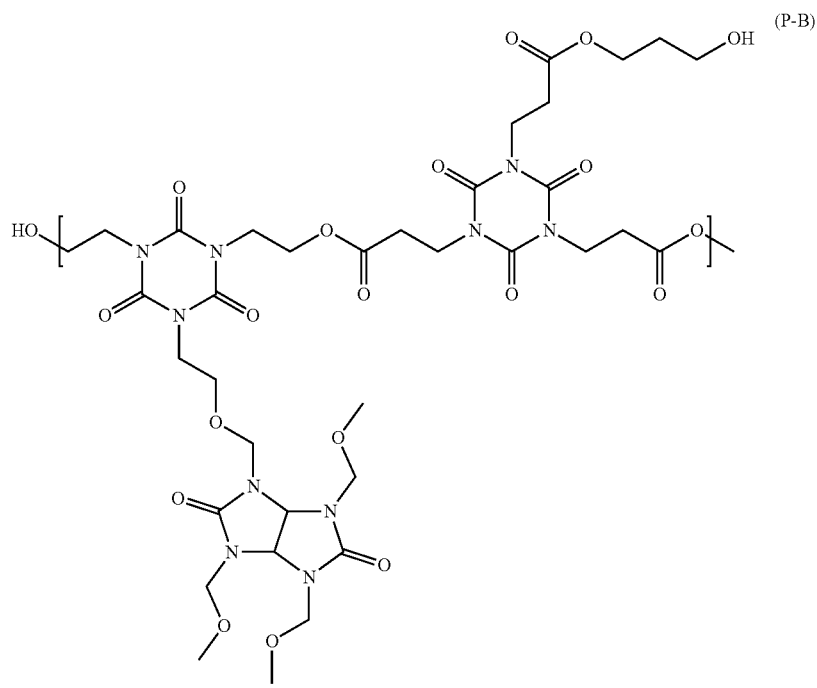
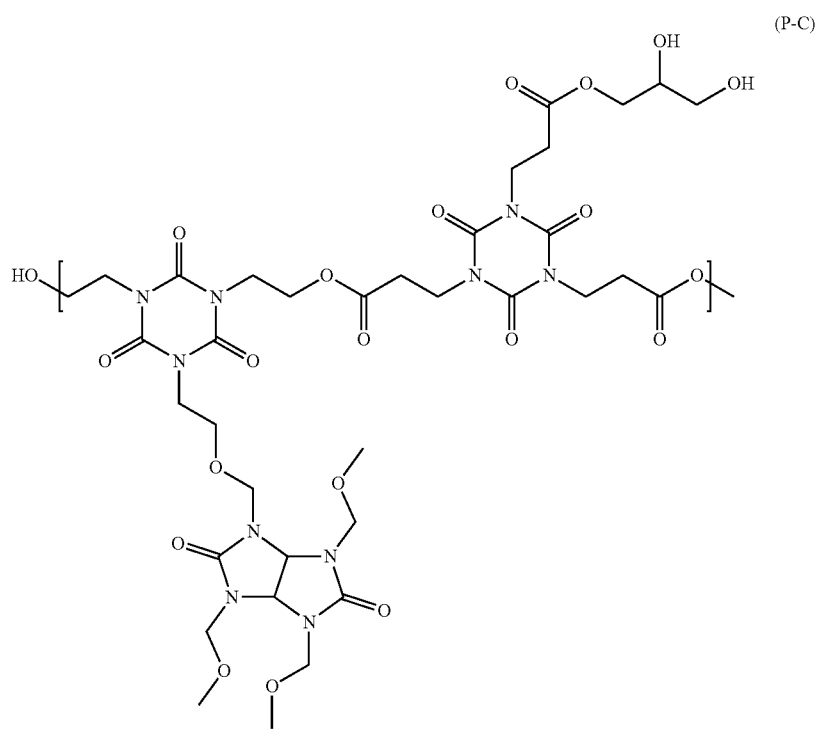

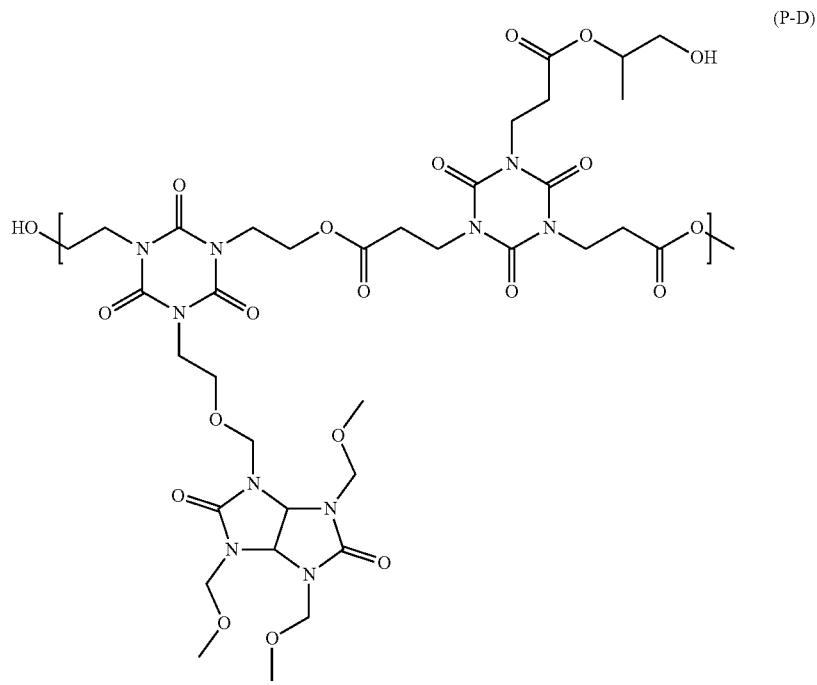
(P-D)
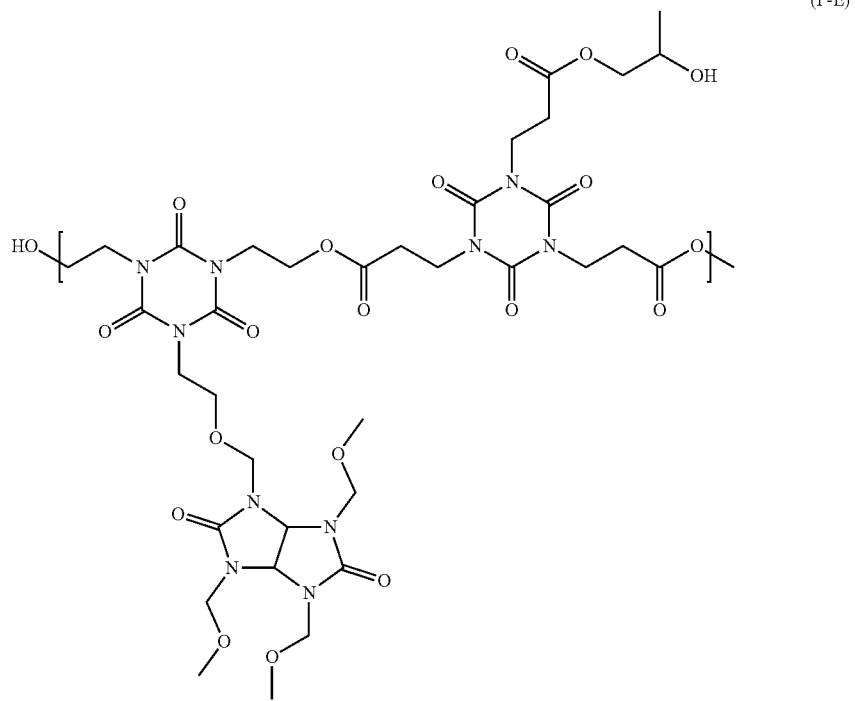
(P-E)

-continued
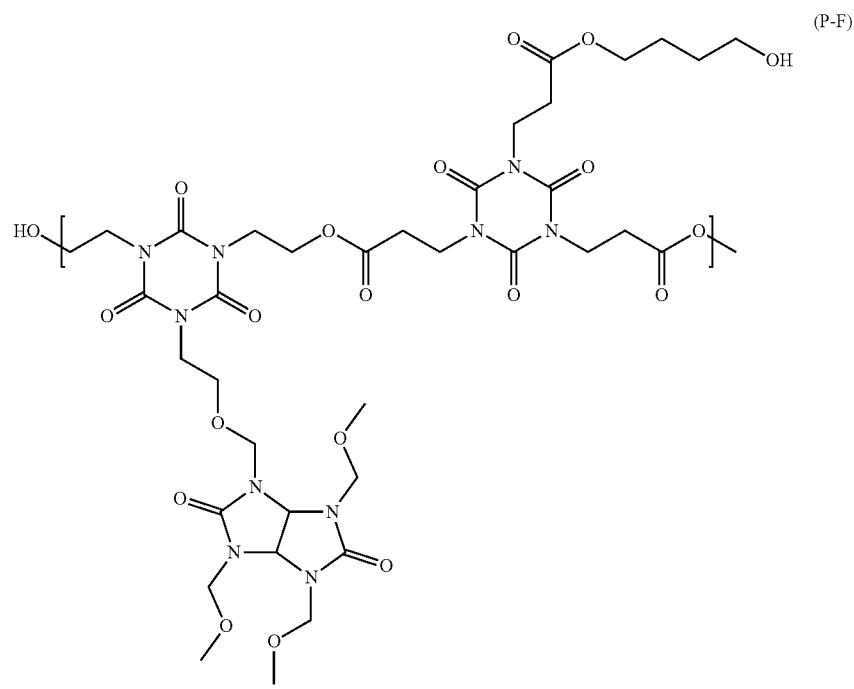
(P-F)
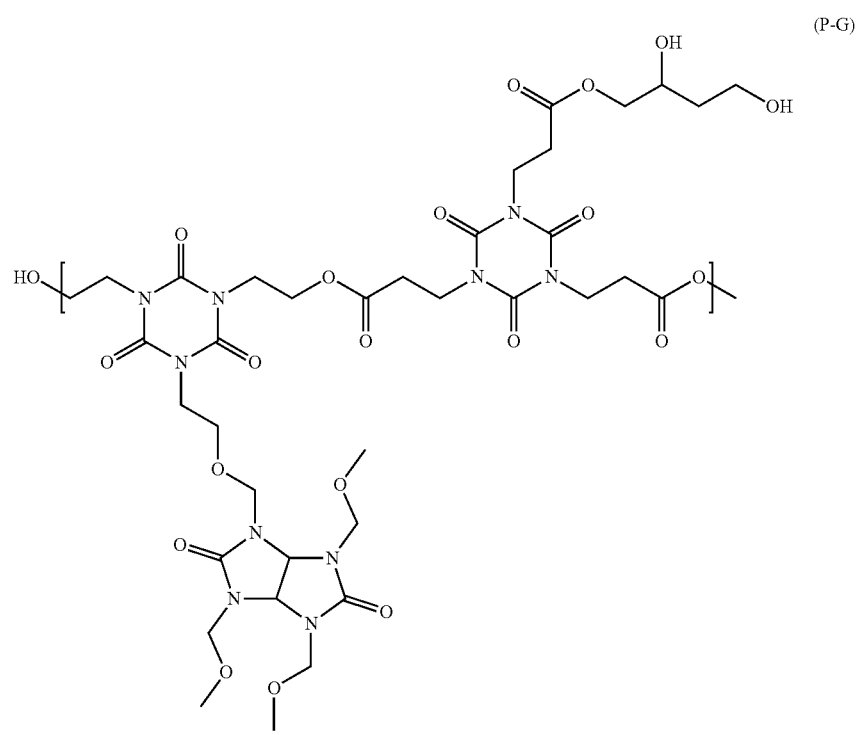
(P-G)

-continued
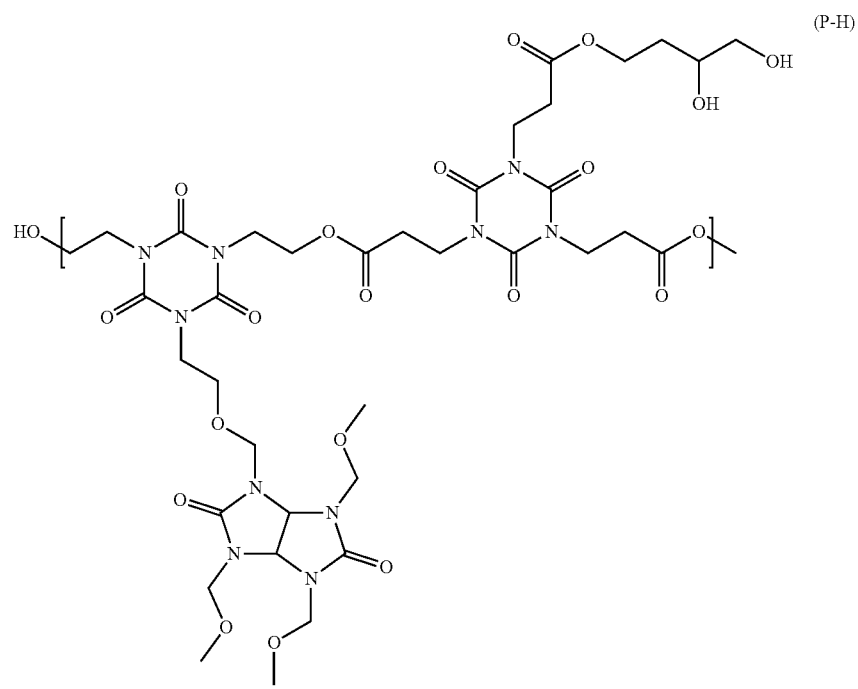
(P-H)
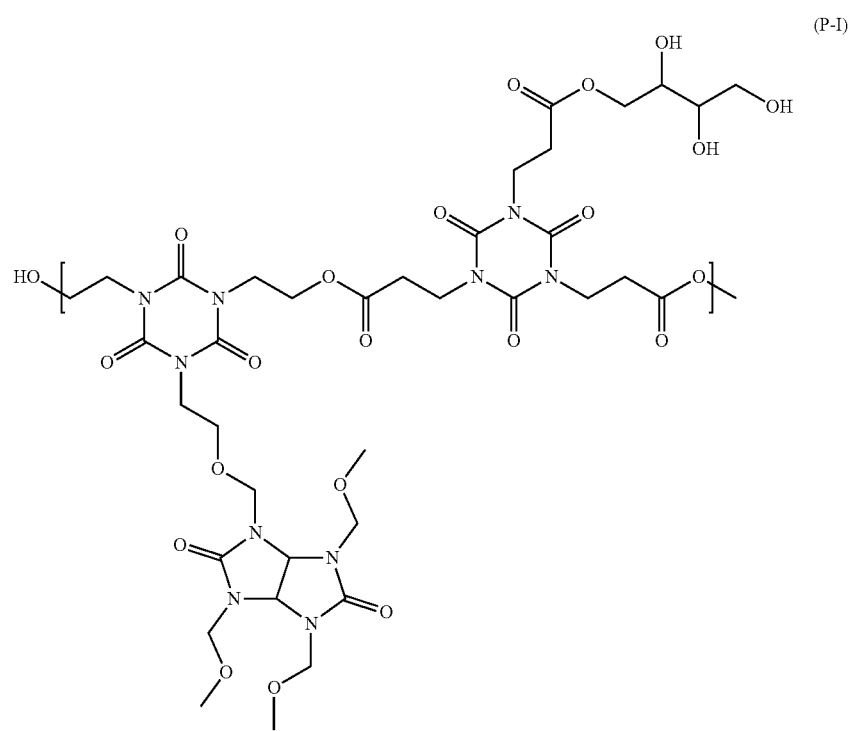
(P-I)

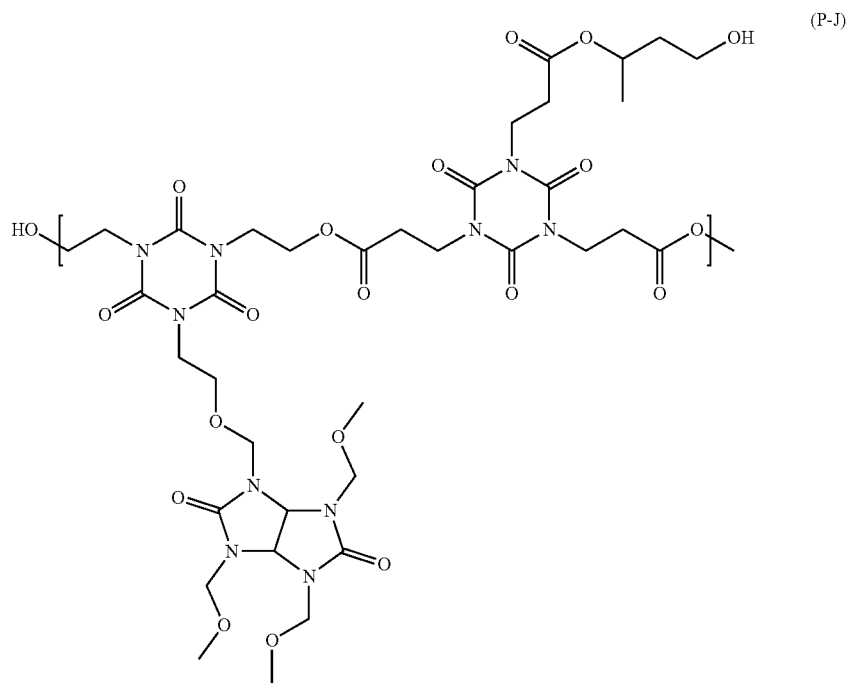
(P-J)
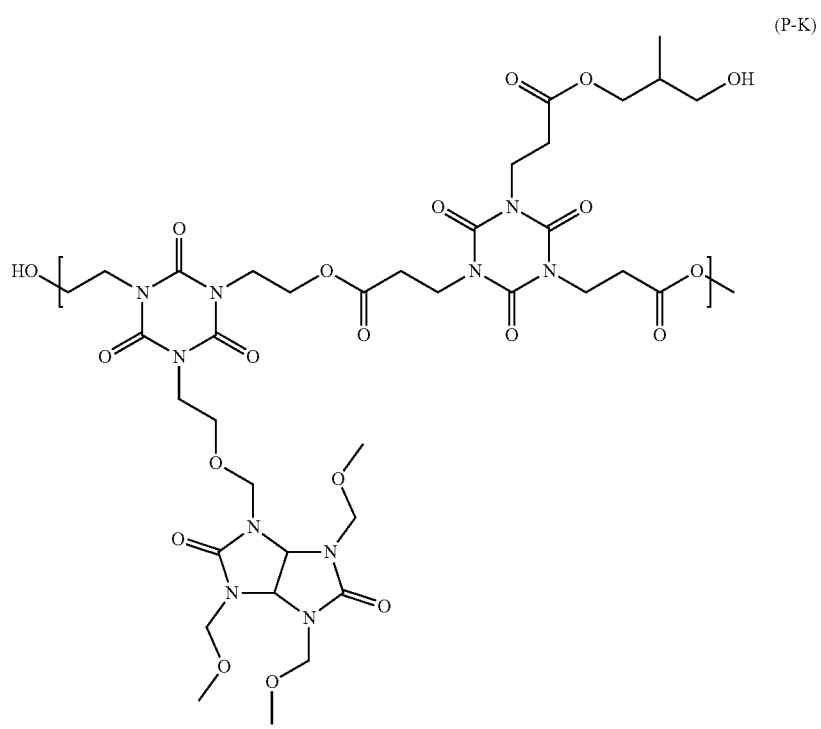
(P-K)

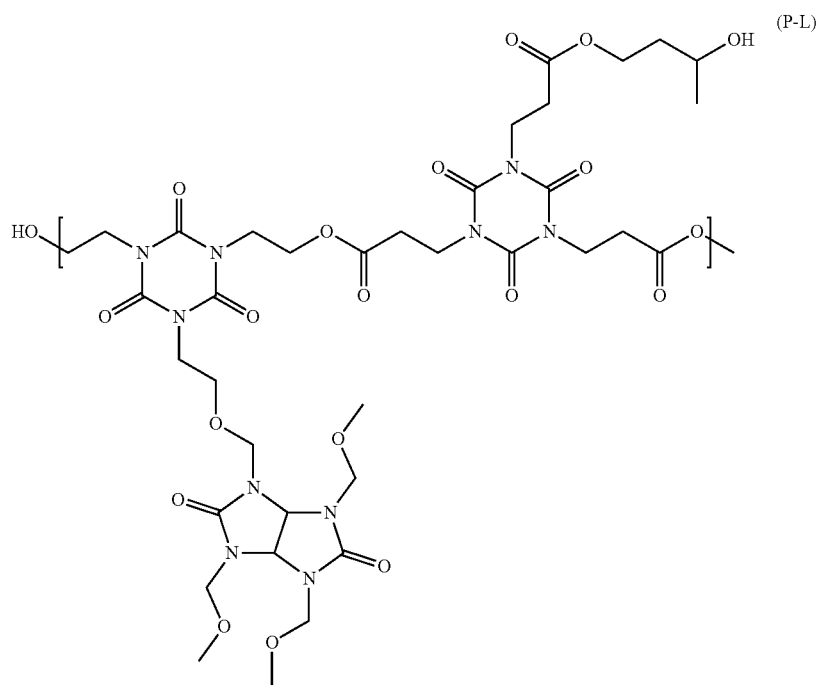
(P-L)
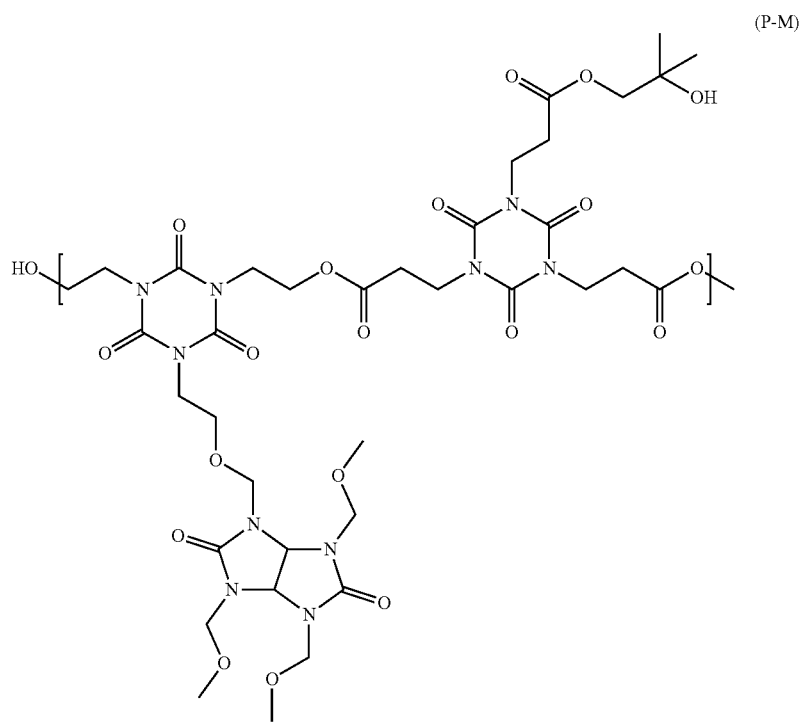
(P-M)

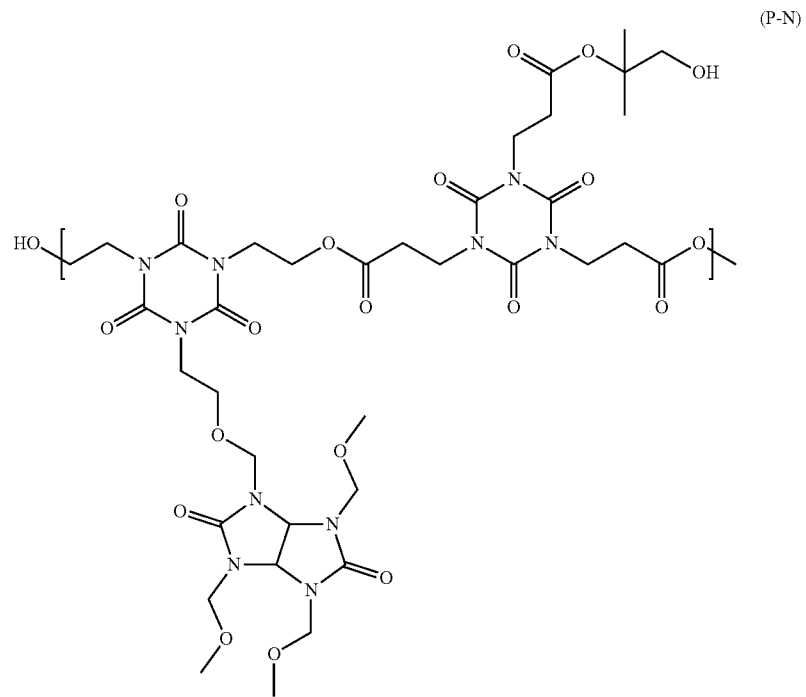
(P-N)
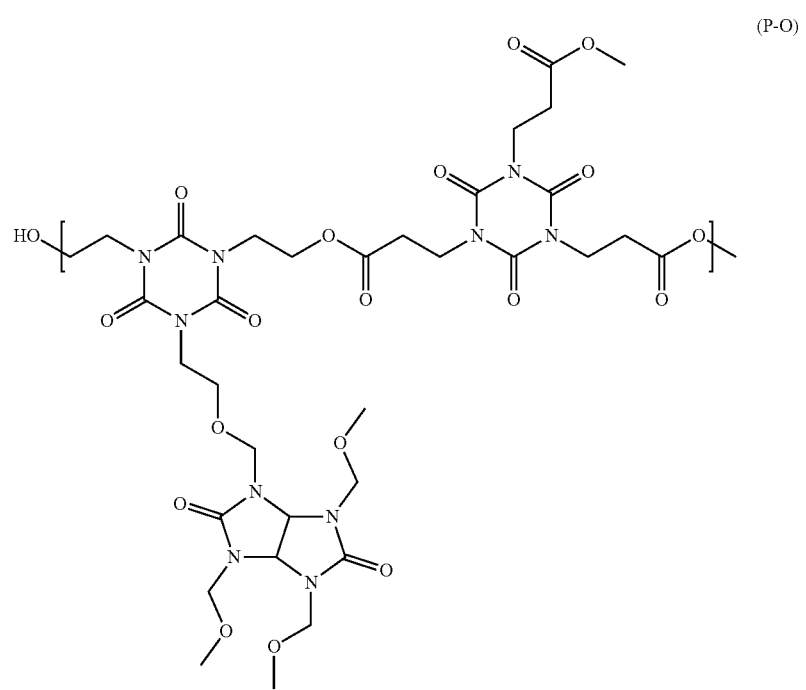
(P-O)

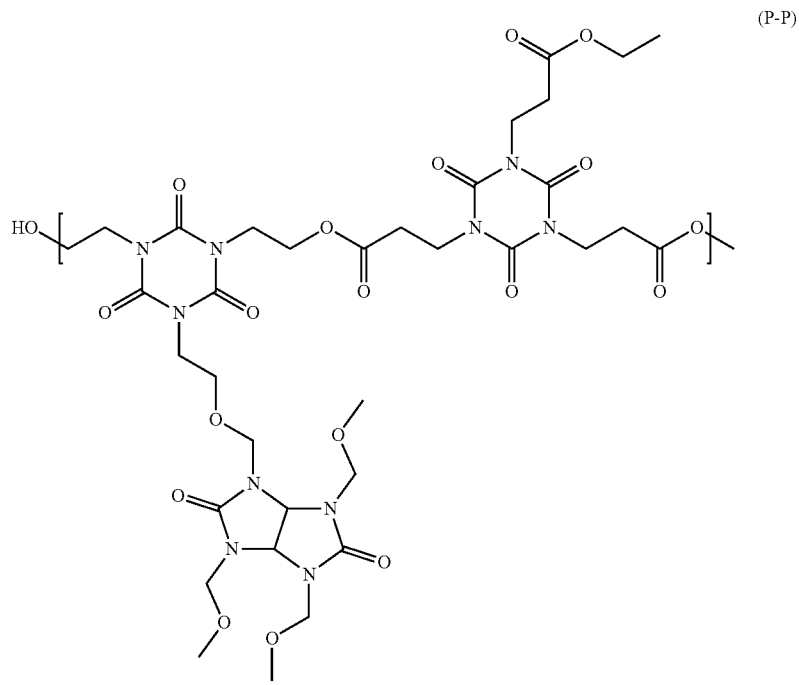
(P-P)
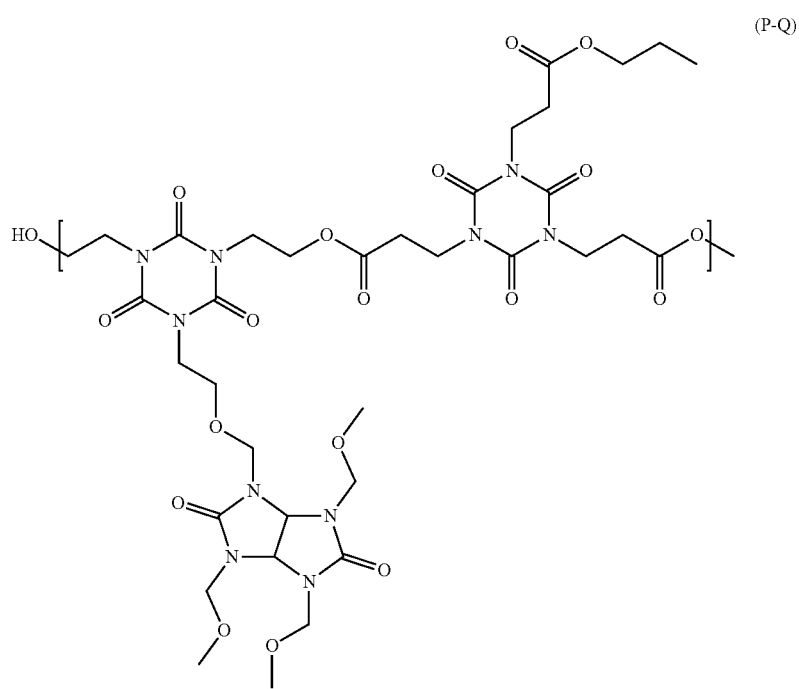
(P-Q)

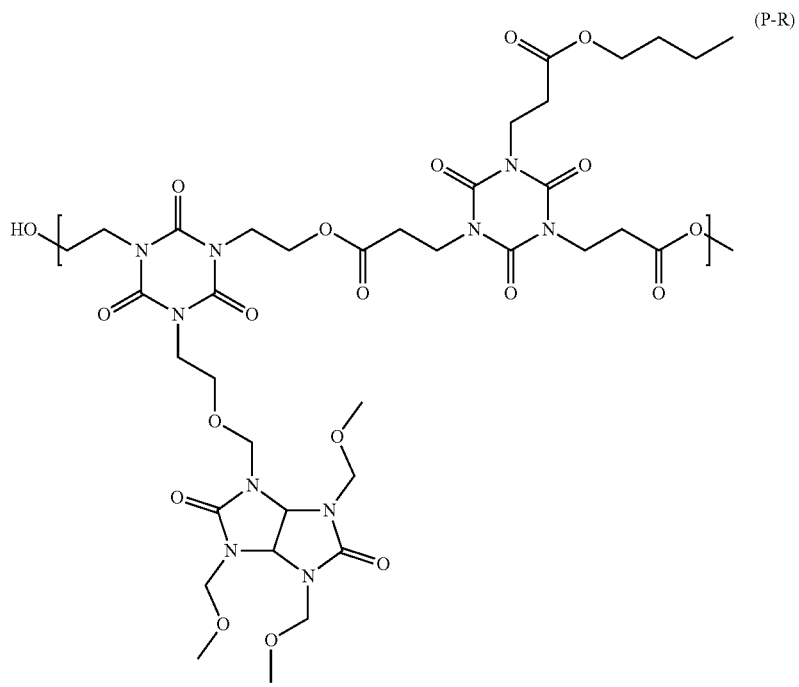

Examples of the polymer including crosslinked cyanurate structural units are also provided in U.S. Patent Publication No. 2011/0033801 A1 and U.S. Patent Publication No. 2019/0129305 A1, the contents of which are incorporated herein in their entireties by reference.

The antireflective composition further includes a thermal acid generator. The thermal acid generator promotes or improves the crosslinking reaction during the curing process of the antireflective coating composition layer. The thermal acid generator may be ionic or substantially neutral thermal acid generators.

In an embodiment, the thermal acid generator may be an arenesulfonic acid generator, for example, a benzenesulfonic acid generator represented by Formula 9:

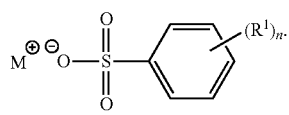

Formula 9

In Formula 9, each $R^1$ is independently a non-hydrogen substituent such as hydroxyl, cyano, halogen (F, Cl, Br, or I), amino, optionally substituted alkyl, optionally substituted heteroalkyl, optionally substituted carbocyclic, or optionally substituted heteroaryl;

n is an integer from 0 to 5; and $M^+$ is a cation.

In another embodiment, the thermal acid generator may be a pyridinium acid generator represented by Formula 10:

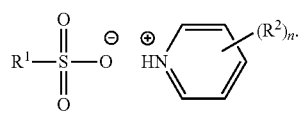

Formula 10

In Formula 10, $R^1$ is a non-hydrogen substituent such as optionally substituted alkyl, optionally substituted heteroalkyl, optionally substituted optionally substituted carbocyclic or optionally substituted heteroaryl;

each $R^2$ is independently a non-hydrogen substituent such as hydroxyl, cyano, halogen (F, Cl, Br or I), amino, optionally substituted alkyl, optionally substituted heteroalkyl, optionally substituted carbocyclic, or optionally substituted heteroaryl; and n is 0 (no $R^2$ groups present, pyridyl ring is not substituted), 1, 2, 3, 4 or 5, and more typically n is 0, 1, 2 or 3.

The amount of one or more thermal acid generators in the antireflective composition may be from 0.1 to 10 percent by weight based on total solids of the antireflective composition. For example, the amount of one or more thermal acid generators in the antireflective composition may be from about 0.5 weight % to 2 weight % based on total solids of the antireflective composition.

The antireflective composition may further include a solvent. The solvent may an organic solvent typically used in the electronics industry, such as propylene glycol methyl ether (PGME), 2-hydroxyisobutyric acid methyl ester (HBM), propylene glycol methyl ether acetate (PGMEA), methyl 3-methoxypropionate (MMP), ethyl lactate, n-butyl acetate, anisole, N-methyl pyrrolidone, gamma-butyrolactone, ethoxybenzene, benzyl propionate, benzyl benzoate, propylene carbonate, xylene, mesitylene, cumene, limonene, and mixtures thereof. Mixtures of organic solvents are may be used, such as a mixture including one or more of anisole, ethoxybenzene, PGME, HBM, PGMEA, GBL, MMP, n-butyl acetate, benzyl propionate and benzyl benzoate in combination with one or more additional organic solvents, for example, a mixture including two or more of anisole, ethoxybenzene, PGME, HBM, PGMEA, GBL, MMP, n-butyl acetate, benzyl propionate, xylene, mesitylene, cumene, limonene, and benzyl benzoate. When a mixture of solvents is used, the ratio of solvents is generally not critical and may vary from 99:1 to 1:99 weight-to-weight (w/w), provided that the solvent mixture is able to dissolve the components of the composition. It will be appreciated by those skilled in the art that the concentration of the components in the organic solvent may be adjusted by removing a portion of the organic solvent or by adding more of the organic solvent, as may be desired.

The solvent component of the composition is typically present in an amount of from 50 to 99.9 weight %, for example, from 55 to 99.9 weight %, from 60 to 99.9 weight %, from 65 to 99.9 weight %, from 70 to 99.9 weight %, from 75 to 99.9 weight %, from 80 to 99.9 weight %, from 85 to 99.9 weight %, from 90 to 99.9 weight %, or from 95 to 99 weight %, based on total solids of the antireflective composition.

The antireflective composition may include one or more optional additives including, for example, surfactants and antioxidants. Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA) and PF-656 (Omnova Solutions, Beachwood, Ohio, USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the antireflective composition in minor amounts such as from 0.01 weight % to 10 weight % based on total solids of the antireflective composition.

An antioxidant may be added to the antireflective composition to prevent or minimize oxidation of organic materials in the antireflective composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)2,4-bisoctyl-thio-1,3,5-triazine, n-octadecyl-3-(4'-hydroxy-3',5$^1$-di-tert-butylphenyl)propionate, octylated phenol, aralkyl-substituted phenols, alkylated p-cresol and hindered phenol; bis-, tris- and polyphenols such as 4,4'-dihydroxydiphenyl, methylenebis(dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3$^1$-di-(a-methylcyclohexyl)-5,5$^1$-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3$^1$,5$^1$-di-tert-butyl-4'-hydroxyphenyl)propionate]methane.

Suitable antioxidants are commercially available, for example, Irganox™ antioxidants (Ciba Specialty Chemicals Corp.). The antioxidants if used are typically present in the antireflective composition in an amount of from 0.01 weight % to 10 weight % based on total solids of the antireflective composition.

The antireflective coating composition disclosed herein may be used to form a film including the antireflective coating composition, wherein the film on the substrate constitutes a coated substrate. Such a coated substrate may include: (a) a substrate having one or more layers to be patterned on a surface thereof; (b) a layer of the antireflective coating composition disposed on a substrate. The coated substrate may further include: (c) a layer of the photoresist composition disposed on the layer of the antireflective coating composition or disposed on one or more layer to be patterned. For example, patterning may be carried out using ultraviolet radiation at a wavelength of less than 248 nm, and in particular, at 193 nm, or by using the EUV. The patternable film thus may include the photoacid generator.

A method for forming a pattern by negative tone development may include the steps of: a) applying a layer of the antireflective coating composition over a substrate; (b) curing the applied antireflective coating composition to form an antireflective layer; (c) forming a photoresist layer over the antireflective layer; and (d) patterning the photoresist layer and transferring the pattern from the patterned photoresist layer to the antireflective layer. The patterning of the photoresist layer and transferring the pattern from the patterned photoresist layer to the antireflective layer may include: (d)(1) exposing the photoresist layer and the antireflective layer to activating radiation, and (d)(2) developing the exposed photoresist layer and antireflective layer with an organic solvent developer.

According to the method, a layer of an antireflective coating composition is first formed on a substrate. The content of the antireflective coating composition is the same as described above, and the antireflective coating composition may be prepared by admixing suitable amounts of source materials including an organic polymer, a photoacid generator, a crosslinker, etc.

The antireflective coating composition may be applied by any conventional means such as spin coating and the like. The antireflective coating composition may be applied on a substrate with a dried layer thickness of between 2.0 nm to 300.0 nm, for example, between 5.0 nm to 30.0 nm.

The applied antireflective coating composition layer may be cured. Cure conditions will vary with the components of the antireflective coating composition. Cure conditions may be, for example, from 80° C. to 250° C. for 0.1 to 40 minutes. Cure conditions may render the antireflective coating composition coating layer substantially insoluble to the photoresist solvent as well as an alkaline aqueous developer solution.

The antireflective coating composition layer may be formed as a single layer or multiple layers. For example, prior to forming the antireflective coating composition layer, a second antireflective coating composition layer that is different than the antireflective coating composition layer is formed on the substrate, and the antireflective coating composition layer is formed on the second antireflective coating composition layer.

The formation of the antireflective coating composition layer can prevent deterioration of the quality of its pattern which is caused by the substrate due to reflecting incident rays when the photoresist composition layer is exposed to radiation, and the formation particularly improves line width (CD) in the pattern and prevents pattern collapse owing to thorough activation of de-blocking of the photoresist composition layer during the exposure process. Additionally, such coatings can also improve depth of focus, exposure latitude and linewidth uniformity.

The substrate may include one or more layers. The layers contained in the substrate may be one or more conductive layers of aluminum, copper, molybdenum, tantalum, titanium, tungsten or alloys thereof; layers of nitrides or silicides; doped amorphous silicon or doped polysilicon; dielectric layers such as layers of silicon oxide, silicon nitride, silicon oxynitrides or metal oxides; semiconductor layers such as single-crystal silicon; glass layers; quartz layers; and combinations or mixtures thereof, but are not limited thereto.

Also, the layers contained in the substrate may be etched to form a pattern by various techniques, for example, chemical vapor deposition (CVD) such as plasma-enhanced CVD, low-pressure CVD or epitaxial growth; physical vapor deposition (PVD) such as sputtering or evaporation; electroplating and the like.

The substrate may include a hard mask layer. Use of a hard mask layer may be desired, for example, with very thin resist layers, where the layers to be etched require a significant etching depth or where the particular etchant has poor resist selectivity. Where a hard mask layer is used, the resist patterns to be formed can be transferred to the hard mask layer and can be used as a mask for etching the underlying layers.

Typical materials for the hard mask include, for example, tungsten, titanium, titanium nitride, titanium oxide, zirconium oxide, aluminum oxide, aluminum oxynitride, hafnium oxide, amorphous carbon, organic polymer, silicon oxynitride, silicon nitride and silicon-organic hybrid materials, but not limited thereto. The hard mask layer may be formed by, for example, CVD, PVD or spin coating technique. The hard mask layer can include a single layer or a plurality of layers of different materials.

A layer of a photoresist composition is then formed on the antireflective coating composition layer. The photoresist composition may include a matrix polymer, a photoacid generator and a solvent.

The matrix polymer may include at least one unit having an acid-cleavable protecting group. The acid-cleavable protecting group may be, for example, acetal or ester groups that contain a tertiary non-cyclic alkyl carbon (for example, t-butyl) or a tertiary alicyclic carbon (for example, methyladamantyl) covalently linked to a carboxy oxygen of an ester of the matrix polymer.

Suitable units which can be included in the matrix polymer may be, for example, units derived from (alkyl)acrylate, for example, units derived from acid-cleavable (alkyl)acrylate. Particular examples thereof includes units derived from t-butyl acrylate, t-butyl methacrylate, methyladamantyl acrylate, methyl adamantly methacrylate, ethylfenchyl acrylate, ethylfenchyl methacrylate, etc.

Another example of suitable units which can be included in the matrix polymer may be units derived from a non-aromatic cyclic olefin (endocyclic double bond) such as an optionally substituted norbornene. Still another example of suitable units which can be included in the matrix polymer may be units derived from anhydrides, e.g., maleic anhydride, itaconic anhydride, etc.

Also, the matrix polymer may contain units that contain a heteroatom such as oxygen and sulfur, and, for example, a heterocyclic unit may be fused to the main chain of the matrix polymer. The matrix polymer may be used as a blend of two or more kinds. The matrix polymer may be commercially available or prepared by those skilled in the art.

The matrix polymer of the photoresist composition is used in an amount sufficient to render an exposed coating layer of the photoresist developable with a suitable solution, for example, 50 weight % to 95 weight % based on total solids of the antireflective composition. The weight average molecular weight ($M_w$) of the matrix polymer may be less than 100,000 Daltons, for example, from 5,000 to 100,000 Daltons, for example, 5,000 to 15,000 Daltons.

The photoresist composition may further include a photoactive material employed in an amount sufficient to generate a latent image in a coating layer of the composition upon exposure to activating radiation, and may include a photoacid generator. Suitable photoacid generator may be the same kinds of photoacid generators as explained in the antireflective coating composition.

The photoresist composition may include a solvent, for example, glycol ether such as 2-methoxyethyl ether, ethylene glycol monomethyl ether and propylene glycol monomethyl ether; propylene glycol monomethyl ether acetate; lactates such as ethyl lactate and methyl lactate; propionate such as methyl propionate, ethyl propionate, ethyl ethoxy propionate and methyl-2-hydroxyisobutyrate; methyl cellosolve acetate; aromatic hydrocarbon such as toluene and xylene; ketone such as acetone, methyl ethyl ketone, cyclohexanone and 2-heptanone. Such solvents may be used alone or in combination of two or more solvents.

The photoresist composition may be applied on to the antireflective coating composition layer by spin coating, dipping, roller coating or other conventional coating technique. For example, spin coating may be used. For the spin coating, the solids content of the coating solution can be adjusted to provide a desired film thickness based upon the specific coating equipment utilized, the viscosity of the solution, the speed of the coating tool and the amount of time allowed for spinning.

A thickness of the photoresist composition layer may be, for example, 50 nm to 300 nm.

Next, the photoresist composition layer may be soft-baked to minimize the solvent content in the layer, thereby forming a tack-free coating and improving adhesion of the layer to the substrate. The soft-bake can be conducted on a hotplate or in an oven. The soft-bake temperature and time will depend on the particular material of the photoresist and thickness. For example, typical soft-bakes are conducted at a temperature of from 90° C. to 150° C. for about 30 seconds to 90 seconds.

Additionally, an overcoating layer may be formed on the photoresist composition layer. The overcoating layer may be formed for uniform resist pattern, reduction of reflectance during the exposure process of the resist, improved depth of focus and exposure latitude and reduction in defects. The overcoating layer may be formed by spin coating technique using an overcoating composition. The solids content of the coating solution can be adjusted to provide a desired film thickness based upon the specific coating equipment utilized, the viscosity of the solution, the speed of the coating tool and the amount of time allowed for spinning. A thickness of the overcoating layer may be, for example 200 Angstroms (Å) to 1,000 Å.

The overcoating layer may be soft-baked to minimize the solvent content in the layer. The soft-bake can be conducted on a hotplate or in an oven. Typical soft-bakes are conducted at a temperature of from 80° C. to 120° C. for about 30 seconds to 90 seconds.

The photoresist composition layer is then exposed to activating radiation through a photomask to create a difference in solubility between exposed and unexposed regions. The photomask has optically transparent and optically opaque regions.

The exposure wavelength may be, for example, 400 nm or less, 300 nm or less, or 200 nm or less, for example, 248 nm (for example, KrF excimer laser light) or 193 nm (for example, ArF excimer laser light. The exposure energy is typically from about 10 to 80 milliJoules per square centimeter ($mJ/cm^2$), dependent upon the exposure device and the components of the photosensitive composition.

After the exposure step of the photoresist composition layer, a post exposure bake (PEB) is conducted. PEB may be conducted on a hotplate or in an oven. PEB conditions may vary with the components of the photoresist composition layer and thickness. For example, typical PEB is conducted at a temperature of from 80° C. to 150° C. for about 30 seconds to 90 seconds. Thus, a latent image is produced in the photoresist composition layer due to difference in solubility between light exposed and unexposed regions.

The overcoating layer and the exposed photoresist composition layer are then developed to remove unexposed regions, thus forming a resist pattern. The developer is typically an organic developer, for example, a solvent selected from ketones, esters, ethers, amides, hydrocarbons and mixtures thereof. Examples of suitable ketone include acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Examples of suitable ester include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Examples of suitable ether include dioxane, tetrahydrofuran and glycol ether (for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol). Examples of suitable amide include N-methyl-2-pyrrolidone, N,N-dimethylacetamide and N,N-dimethylformamide. Examples of suitable hydrocarbon include aromatic hydrocarbon solvents (for example, toluene and xylene).

The developer may contain a solvent which can be used in the photoresist composition, for example, 2-heptanone, butyl acetate (for example, n-butyl acetate). The developer may contain mixtures of these solvents, or one or more of the listed solvents mixed with a solvent other than those described above or mixed with water. For example, the developer may contain a mixture of a first organic solvent and a second organic solvent. Particular examples of the first organic solvent are $C_4$-$C_9$ ketones; hydroxyalkyl esters such as methyl 2-hydroxyisobutyrate, ethyl lactate; and linear or branched $C_5$-$C_6$ alkoxy alkyl acetate such as propylene glycol monomethyl ether acetate, for example, 2-heptanone or 5-methyl-2-hexanone. Examples of the second organic solvent are linear or branched $C_6$-$C_8$ alkyl esters such as n-butyl acetate, n-pentyl acetate, n-butyl propionate, n-hexyl acetate, n-butyl butyrate and isobutyl butyrate; and linear or branched $C_8$-$C_9$ ketones such as 4-octanone, 2,5-dimethyl-4-hexanone, 2,6-dimethyl-4-heptanone, for example, n-butyl acetate, n-butyl propionate or 2,6-dimethyl-4-heptanone. Examples of combinations of the first and the second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone, 2-heptanone/n-butyl acetate. Of these combinations, 2-heptanone/n-butyl acetate or 2-heptanone/n-butyl propionate may be preferred.

The solvent can be present in the developer in an amount of from 90 to 100 weight %, for example, greater than 95 weight %, greater than 98 weight %, greater than 99 weight % or 100 weight %.

The developer may also include optional additives, for example, surfactants, etc. Such optional additives typically will be present in minor concentrations, for example, about 0.01 to 5 weight %.

The developer can be applied on to the photoresist composition layer by known techniques, for example, spin coating or puddle coating. The development time is for a period effective to remove the unexposed regions of the photoresist. For example, the development is conducted for 5 to 30 seconds at room temperature.

The developed photoresist composition layer may be further cured by performing additional baking at a temperature of 100° C. to 150° C. for several minutes.

The developed substrate may have a substrate region from which a photoresist is removed, and the substrate region may be treated in a selective manner. For example, the substrate region from which the photoresist is removed may be chemically etched or plated using a method well known in the related art. A hydrofluoric acid etching solution, and a plasma gas etching agent such as an oxygen plasma etching agent may be used as an etching agent. For example, the antireflective coating composition layer may be removed and the substrate may be etched using the plasma gas etching agent.

Hereinafter, the present disclosure is illustrated in more detail with reference to examples. However, these examples are exemplary, and the present disclosure is not limited thereto.

EXAMPLES

Synthesis of Polymers

Example 1

A 3-necked 100 mL round bottom flask was equipped with a thermocouple, a Dean-Stark trap, a condenser, and a heating oil bath. Tris(2-hydroxyethyl) iso-cyanurate (30.4 g, 116.5 mmol), tris(2-carboxyethyl) iso-cyanurate (20.1 g, 58.2 mmol), n-butanol (20.0 g, 270.0 mmol), p-toulenesulfonic acid (0.5 g, 2.8 mmol) and anisole (34 g) were weighed into a flask. The reaction mixture was heated to 150° C. with stirring for 3 h, cooled to room temperature, and diluted with HBM (160 g). The mixed solution (40 g), p-toluenesulfonic acid (0.07 g, 0.35 mmol) and 1,3,4,6-tetrakis(methoxymethyl)tetrahydroimidazo[4,5-d]imidazole-2,5(1H,3H)-dione (3.6 g, 7.4 mmol) were weighed and heated to 50° C. with stirring for 4 h. The solution was quenched with triethylamine (0.4 mL) and cooled to room temperature. Mixture solution was precipitated with IPA/heptane, filtered, and vacuum dried for 24 h at 40° C.

Synthesis of Cross-Linkable Photoacid Generators

Example 2

(4-Hydroxyphenyl)diphenylsulfonium trifluoromethanesulfonate

Sodium trifluoromethanesulfonate (25.0 g, 1.0 eq) and (4-hydroxyphenyl)diphenylsulfonium iodide (47.2 g, 0.8 eq) were dissolved in methylene chloride (360 g) and deionized water (360 g), and stirred at room temperature overnight. The organic layer was washed with deionized water (360 g×5), and the solvent was evaporated. The crude product was precipitated from iso-propanol/heptane and dried under vacuum.

Example 3

(4-Hydroxyphenyl)diphenylsulfonium 1,1,2,2,3,3,4,4,4-nonafluorobutane-1-sulfonate Lithium 1,1,2,2,3,3,4,4,4-nonafluorobutane-1-sulfonate (10.0 g, 1.0 eq) and (4-hydroxyphenyl)diphenylsulfonium iodide (10.6 g, 0.8 eq) were dissolved in methylene chloride (85 g) and deionized water (85 g), and stirred at room temperature overnight. The organic layer was washed with deionized water (85 g×5), and the solvent was evaporated. The crude product was precipitated from iso-propanol/heptane and dried under vacuum.

Example 4

(4-(2-Hydroxyethoxy)phenyl)diphenylsulfonium trifluoromethanesulfonate (1) (4-Hydroxyphenyl)diphenylsulfonium iodide (4.0 g, 1.0 eq), potassium carbonate (1.6 g, 1.1 eq) and potassium iodide (0.4 g, 0.25 eq) were dissolved in DMF (103 g) and 2-(2-chloroethoxy)tetrahydro-2H-pyran (1.8 g, 1.1 eq) was the added. The mixture was stirred at 100° C. for 16 h. The organic layer was washed with deionized water. The mixture was precipitated from heptane/methylene chloride and dried under vacuum to obtain solid in 4.8 g (91%).

(2) Potassium trifluoromethanesulfonate (2.00 g, 1.8 eq) and diphenyl(4-(2-((tetrahydro-2H-pyran-2-yl)oxy)ethoxy)phenyl)sulfonium iodide (3.06 g, 1 eq) were dissolved in chloroform (100 g) and deionized water (30 g), and stirred at room temperature overnight. The organic layer was washed with deionized water (30 g×2), and the solvent was evaporated under reduced pressure. The product was obtained sticky liquid in 3.0 g (94%).

(3) Diphenyl(4-(2-((tetrahydro-2H-pyran-2-yl)oxy)ethoxy)phenyl) sulfonium trifluoromethanesulfonate (3.1 g, 1.0 eq) was dissolved in methanol (65 g) and 4 N hydrogen chloride solution (3 mL) was added. The mixture was stirred at room temperature for 16 h. Solvent was evaporated under reduced pressure. The product was obtained sticky liquid in 2.3 g (88%).

Example 5

(4-(2-hydroxyethoxy)phenyl)diphenylsulfonium 1,1,2,2,3,3,4,4,4-nonafluorobutane-1-sulfonate (1) 2-(3-Chloroethoxy)tetrahydro-2H-pyran (4.5 g, 1.0 eq), potassium carbonate (4.4 g, 1.3 eq), and potassium iodide (1.0 g, 0.3 eq) were added to solution of (4-hydroxyphenyl)diphenylsulfonium iodide (10.0 g, 1.0 eq) in 114 g of DMF at 100° C. heating. The solution was cooled to room temperature and filtered to obtain a solution. The crude product was recrystallized from methylene chloride/heptane and dried under vacuum to obtain 13 g of a sticky light brownish powder (99%).

(2) Lithium nonafluoro 1-butanesulfonate (4.0 g, 1.4 eq) and diphenyl(4-(2-((tetrahydro-2H-pyran-2-yl)oxy)ethoxy)phenyl)sulfonium iodide (5.0 g, 1.0 eq) were dissolved in methylene chloride (133 g) and deionized water (50 g), and the mixture was stirred at room temperature overnight. The organic layer was washed with deionized water (40 g×4), and the solvent was evaporated to obtain brownish solid in 6.4 g (97%).

(3) Diphenyl(4-(2-((tetrahydro-2H-pyran-2-yl)oxy)ethoxy)phenyl)sulfonium nonafluorobutanesulfonate (6.4 g) and 4 N hydrochloric acid in dioxane (1.5 mL) were dissolved in methanol (51 g), and the reaction mixture was stirred at room temperature overnight. The mixture was evaporated, and the solution was diluted with methylene chloride (66 g). The organic layer was washed with saturated sodium bicarbonate solution (66 g×1) and deionized water (40 g×3). The crude product was precipitated from methylene chloride/heptane and dried under vacuum to obtain sticky liquid in 4.4 g (78%).

Example 6

(4-(3-Hydroxypropoxy)phenyl)diphenylsulfonium trifluoromethanesulfonate (1) (4-Hydroxyphenyl)diphenylsulfonium iodide (10.2 g, 1.0 eq), potassium carbonate (4.5 g, 1.3 eq), and potassium iodide (2.1 g, 0.5 eq) were dissolved in DMF (103 g), and 2-(2-chloroethoxy)tetrahydro-2H-pyran (4.9 g, 1.1 eq) was added. The mixture was stirred at 100° C. for 16 h. The mixture was cooled to room temperature and filtered through celite, and the solvent was evaporated under reduced pressure. The mixture was precipitated from heptane/methylene chloride and dried under vacuum to obtain 12.9 g (94%) as a solid.

(2) Potassium trifluoromethanesulfonate (2.8 g, 1.4 eq) and diphenyl(4-(3-((tetrahydro-2H-pyran-2-yl)oxy)propoxy)phenyl)sulfonium trifluoromethanesulfonate (6.1 g, 1.0 eq) were dissolved in chloroform (100 g) and deionized water (30 g) and stirred at room temperature overnight. The organic layer was washed with deionized water (30 g×2), and the solvent was evaporated under reduced pressure. The product was obtained sticky liquid in 6.1 g (97%).

(3) Diphenyl(4-(3-((tetrahydro-2H-pyran-2-yl)oxy)propoxy)phenyl)sulfonium trifluoromethanesulfonate (5.8 g, 1.0 eq) was dissolved in methanol (60 g) and a 4 N hydrogen chloride solution (3 mL) was added. The mixture was stirred at 24° C. for 16 h. The mixture was evaporated under reduced pressure and dried under vacuum to obtain 4.2 g (84%) of product.

Example 7

(4-(3-Hydroxypropoxy)phenyl)diphenylsulfonium 1,1,2,2,3,3,4,4-nonafluorobutane-1-sulfonate (1) (4-Hydroxyphenyl)diphenylsulfonium iodide (10.2 g, 1.0 eq), potassium carbonate (4.5 g, 1.3 eq) and potassium iodide (2.1 g, 0.5 eq) were dissolved in DMF (103 g), and 2-(2-chloroethoxy)tetrahydro-2H-pyran (4.9 g, 1.1 eq) was added. The mixture was stirred at 100° C. for 16 h. After the reaction was complete, the mixture was cooled to room temperature, filtered through celite, and the solvent was evaporated under reduced pressure. The mixture was precipitated from heptane/methylene chloride and dried under vacuum to obtain solid in 12.9 g (94%).

(2) Lithium nonafluorobutane-1-sulfonate (3.6 g, 1.3 eq) and diphenyl(4-(3-((tetrahydro-2H-pyran-2-yl)oxy)propoxy)phenyl)sulfonium trifluoromethanesulfonate (5.0 g, 1 eq) were dissolved in methylene chloride (100 g) and deionized water (50 g), and the reaction mixture was stirred at room temperature overnight. After the reaction, the organic layer was washed with deionized water (30 g×2), the solvent was evaporated under reduced pressure. The product was obtained sticky liquid in 6.1 g (94%).

(3) Diphenyl(4-(3-((tetrahydro-2H-pyran-2-yl)oxy)propoxy)phenyl)sulfonium nonafluorobutane-1-sulfonate (6.2 g, 1.0 eq) was dissolved in methanol (60 g), and 4 N hydrogen chloride solution (3 mL) was added. The mixture was stirred at 24° C. for 16 h. After the reaction was complete, the solvent was evaporated under reduced pressure. The product was obtained in 4.5 g (84%).

Preparation of Antireflective Compositions

Example 8

0.65 g of the polymer prepared according to Example 1, 0.10 g of a tetramethoxy methyl glycoluril, 0.01 g of 2,4,6-trimethylpyridinium p-toluenesulfonate, and 0.02 g of the crosslinkable PAG prepared according to Example 2 were dissolved in 99.22 g of HBM solvent.

Example 9

0.65 g of the polymer prepared according to Example 1, 0.10 g of a tetramethoxy methyl glycoluril, 0.01 g of 2,4,6-trimethylpyridinium p-toluenesulfonate and 0.02 g of the crosslinkable PAG prepared according to Example 3 were dissolved in 99.22 g of HBM solvent.

Example 10

0.73 g of the polymer prepared according to Example 1, 0.02 g of a tetramethoxy methyl glycoluril, 0.01 g of 2,4,6-trimethylpyridinium p-toluenesulfonate, and 0.02 g of the crosslinkable PAG prepared according to Example 4 were dissolved in 99.22 g of HBM solvent.

Example 11

0.72 g of the polymer prepared according to Example 1, 0.02 g of a tetramethoxy methyl glycoluril, 0.01 g of 2,4,6-trimethylpyridinium p-toluenesulfonate, and 0.02 g of the crosslinkable PAG prepared according to Example 5 were dissolved in 99.22 g of HBM solvent.

Example 12

0.73 g of the polymer prepared according to Example 1, 0.02 g of a tetramethoxy methyl glycoluril, 0.01 g of 2,4,6-trimethylpyridinium p-toluenesulfonate, and 0.02 g of the crosslinkable PAG prepared according to Example 6 were dissolved in 99.22 g of HBM solvent.

Example 13

0.72 g of the polymer prepared according to Example 1, 0.02 g of a tetramethoxy methyl glycoluril, 0.01 g of 2,4,6-trimethylpyridinium p-toluenesulfonate, and 0.02 g of the crosslinkable PAG prepared according to Example 7 were dissolved in 99.22 g of HBM solvent.

Comparative Example 1

0.73 g of the polymer prepared according to Example 1, 0.02 g of a tetramethoxy methyl glycoluril, 0.01 g of 2,4,6-trimethylpyridinium p-toluenesulfonate, and 0.02 g of triphenylsulfonium 1,1,2,2,3,3,4,4,4-nonafluorobutane-1-sulfonate were dissolved in 99.22 g of HBM solvent.

Lithographic Evaluation of Antireflective Compositions

1. Thickness Measurement 200 mm bare silicon wafers were coated on a TEL MARK track with BARC material coated on 1500 RPM and cured at 205° C. for 60 seconds. The coated wafers were inspected on an Opti-Probe tool for thickness measurement.

2. Film Strip Testing

BARC materials were spin-coated in 8 inch silicon wafer and baked at 205° C. for 60 sec by MARK track (Step 1). Coated wafer was exposed to 30 mL of PGMEA:HBM (Ratio 50 wt %: 50 wt %) for 90 sec, spun-dry to form thin film and cured at 110° C. for 60 sec (Step 2). The film thickness was measured at initial coated film (Step 1) and post baked film (Step 2) by Opti-probe. The amount of stripping was determined to be the difference between the Step 1 and Step 2 thicknesses.

3. Contact Angle Measurement

BARC materials were formed by spin-coating on 8 inch silicon wafer at a 1,500 rpm spin rate. The film was cured on a hotplate at 205° C. for 60 seconds to remove residual solvent. Water contact angles were determined using a JDSA-100 Dynamic Contact Angle Goniometer and a drop of water (3 ul) was placed directly on the BARC substrate to measure 9 points.

4. On-Set Testing 200 mm bare silicon wafers were coated on a TEL MARK track with BARC material coated on 1,500 RPM and cured at each 60° C., 70° C., 80° C., 90° C., 100° C., 110° C., 120° C. temperatures for 60 sec. Each coated wafers were exposed to 30 mL of PGMEA:HBM (Ratio 50 wt %: 50 wt %) for 90 sec, spun-dry to form thin film and cured at 110° C. for 60 sec. The film thickness was measured on post baked film by Opti-probe. The on-set temperature was determined by increased film thickness represented to starting point of cross-linking reaction.

5. Litho Evaluation 300 mm bare silicon wafers were coated on a TEL Lithius 300 mm wafer track with AR™ 46 (Dupont) and cured at 205° C. for 60 seconds to form a 650 Å first BARC layer. BARC material for litho evaluation was coated over the first BARC layer and cured at 205° C. for 60 seconds to form a 190 Å second BARC layer. Dupont ArF-i NTD photoresist was coated over the BARC layer stack and soft-baked at 100° C. for 60 seconds to form 900 Å thickness. The wafers were exposed on a NIKON 610C immersion scanner at 1.3 NA, 0.80/0.64 inner/outer sigma, annular illumination, through a photomask to form a 46/94 nm line/space pattern. The wafers were post-exposure baked (PEB) at 90° C. for 60 seconds. The wafers were developed with n-butyl acetate (NBA) developer and spun-dry to form photoresist patterns. The patterned wafers were inspected on a CD-SEM tool and results of litho analysis were provided in Table 2.

Newly formulated crosslinkable PAG (Examples 8-13) showed improved solvent strip loss by a crosslinking reaction with BARC polymer than Comparative Example 1 with comparable on-set and contact angle performance (Table 1).

TABLE 1

|  | Film strip loss by organic solvent | Contact angle by DIW | On-set temperature |
| --- | --- | --- | --- |
| Example 8 | −2.0 Å | 70° | 80° C. |
| Example 9 | −2.1 Å | 71° | 80° C. |
| Example 10 | −1.8 Å | 69° | 90° C. |
| Example 11 | −1.2 Å | 70° | 90° C. |
| Example 12 | −1.6 Å | 69° | 80° C. |
| Example 13 | −1.1 Å | 69° | 90° C. |
| Comparative Example 1 | −5.6 Å | 68° | 80° C. |

The cross-linkable PAG (Examples 8-13) containing new BARC formulation shown improved EL and wider FL margin performance by effective acid generation with crosslinking reaction than Comparative Example 1 (Table 2).

TABLE 2

|  | EoP [mJ/cm²] | EL [nm/% dose] | EL PCM [Trench CD, nm] | FL Margin [nm] |
| --- | --- | --- | --- | --- |
| Example 8 | 66.8 | 0.62 | 47.2 | 200 |
| Example 9 | 66.2 | 0.61 | 50.01 | 200 |
| Example 10 | 66.0 | 0.64 | 48.3 | 200 |
| Example 11 | 66.9 | 0.63 | 50.1 | 200 |
| Example 12 | 66.5 | 0.65 | 48.0 | 180 |
| Example 13 | 66.3 | 0.66 | 51.0 | 220 |
| Comparative Example 1 | 66.4 | 0.62 | 47.3 | 180 |

*EoP: Optimum exposure, EL: Exposure Latitude, FL: Focus Latitude, PCM: Pattern Collapse Margin While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. An antireflective coating composition, comprising:
   a polymer, wherein the polymer comprises a cyanurate structural unit,
   a photoacid generator comprising a crosslinkable group,
   a compound capable of crosslinking the polymer and the photoacid generator,
   a thermal acid generator, and
   an organic solvent,
   wherein the photoacid generator is an onium salt having G⁺A⁻ formula wherein G⁺ has Formula 1 and A⁻ is a non-polymerizable organic anion:

Formula 1 wherein, in Formula 1,
Y is I or S,
each $R^1$ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein when Y is S, one of the $R^1$ is optionally attached to one adjacent $R^1$ by a single bond or a linking group,
provided that at least one $R^1$ is a monocyclic $C_{6-30}$ aryl group bearing a hydroxyl group attached thereto through a single bond or an unsubstituted or substituted $C_1$-$C_{30}$ linking group optionally including at least one heteroatom selected from O, S, N, and P, and
z is 2 or 3, wherein when Y is I, z is 2, or when Y is S, z is 3.

2. The antireflective coating composition of claim 1, wherein G⁺ is represented by Formula 2:

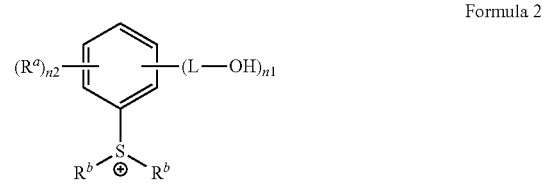

Formula 2 wherein, in Formula 2,
each $R^a$ is independently hydrogen, halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group,
each $R^b$ is a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein groups $R^b$ are optionally attached to each other by a single bond or a linking group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH$_2$— group is optionally replaced by —SO$_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

n1 is an integer from 1 to 5, and n2 is an integer from 0 to 4, provided that the sum of n1 and n2 does not exceed 5.

3. The antireflective coating composition of claim 1, wherein G$^+$ is represented by Formula 3:

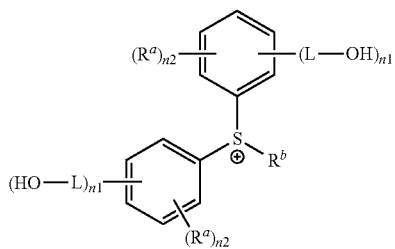

Formula 3 wherein, in Formula 3, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, wherein groups $R^a$ are optionally attached to each other by a single bond or a linking group, $R^b$ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH$_2$— group is optionally replaced by —SO$_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5, each n2 is an integer from 0 to 4, and provided that each sum of n1 and n2 does not exceed 5.

4. The antireflective coating composition of claim 1, wherein G$^+$ is represented by Formula 4:

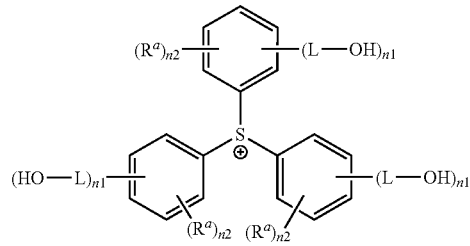

Formula 4 wherein, in Formula 4, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH$_2$— group is optionally replaced by —SO$_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5, each n2 is an integer from 0 to 4, and provided that each sum of n1 and n2 does not exceed 5.

5. The antireflective coating composition of claim 1, wherein the cyanurate structural unit is derived from a compound represented by Formula 5:

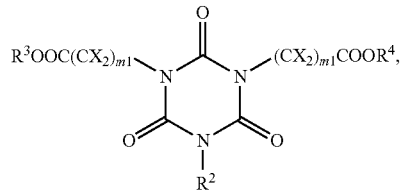

Formula 5 wherein, in Formula 5,
R², R³, R⁴, and each X are independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfinyl group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and
each m1 is independently an integer of 1 to 10.

6. The antireflective coating composition of claim 1, wherein the cyanurate structural unit is derived from a compound represented by Formula 6:

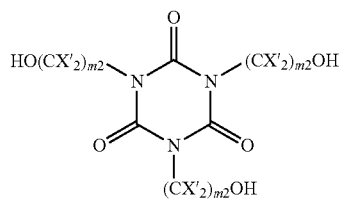

Formula 6 wherein, in Formula 6,
each X' is independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfinyl group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and
each m2 is independently an integer of 1 to 10.

7. The antireflective coating composition of claim 1, wherein the compound capable of crosslinking the photoacid generator and the polymer is represented by Formula 7:

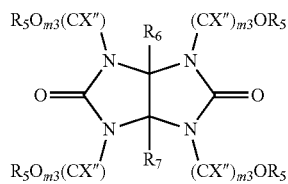

Formula 7 wherein, in Formula 7,
each X', each X", each R⁵, R⁶, and R⁷ are independently hydrogen, a halogen, a hydroxyl group, a substituted or unsubstituted $C_{1-30}$ alkyl group, a substituted or unsubstituted $C_1$-$C_{30}$ alkoxy group, a substituted or unsub-
stituted $C_3$-$C_{30}$ cycloalkyl group, a substituted or unsubstituted $C_7$-$C_{30}$ arylalkyl group, and
each m2 and each m3 are independently an integer of 2 to 10.

8. The antireflective coating composition of claim 1, wherein the thermal acid generator comprises a benzenesulfonic acid generator represented by Formula 9:

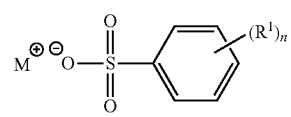

(9)

wherein,
each R¹ is independently hydroxyl, cyano, halogen, amino, optionally substituted alkyl, optionally substituted heteroalkyl, optionally substituted carbocyclic, or optionally substituted heteroaryl; and
n is an integer from 0 to 5; and
M⁺ is a cation.

9. The antireflective coating composition of claim 1, wherein the thermal acid generator comprises a pyridinium acid generator represented by Formula 10:

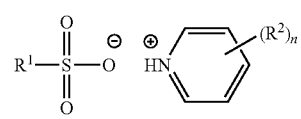

(10)

wherein,
R¹ is optionally substituted alkyl, optionally substituted heteroalkyl, optionally substituted carbocyclic, or optionally substituted heteroaryl;
each R² is independently hydroxyl, cyano, halogen, amino, optionally substituted alkyl, optionally substituted heteroalkyl, optionally substituted carbocyclic, or optionally substituted heteroaryl; and
n is an integer from 0 to 5.

10. The antireflective coating composition of claim 1, wherein A⁻ is a sulfonate anion.

11. The antireflective coating composition of claim 1, wherein the cyanurate structural unit comprises
a first nitrogen ring atom substituted with a first carboxy group of formula—COOR$^a$, wherein R$^a$ is hydrogen or $C_{1-12}$ alkyl, and
a second nitrogen ring atom substituted with a second carboxy group of formula—COOR$^b$, wherein R$^b$ is hydrogen or $C_{1-12}$ alkyl,
provided that the first carboxy group is different from the second carboxy group.

12. A coated substrate, comprising (a) a substrate; and (b) a layer of a antireflective coating composition disposed over the substrate,
wherein the antireflective coating composition comprises:
a polymer, wherein the polymer comprises a cyanurate structural unit,
a photoacid generator comprising a crosslinkable group,
a compound capable of crosslinking the polymer and the photoacid generator,
a thermal acid generator, and
an organic solvent, wherein the photoacid generator is an onium salt having formula G⁺A⁻ wherein G⁺ has Formula 1 and A⁻ is a non-polymerizable organic anion:

Formula 1 wherein, in Formula 1,

Y is I or S, each $R^1$ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein when Y is S, one of the $R^1$ is optionally attached to one adjacent $R^1$ by a single bond or a linking group, provided that at least one $R^1$ is a monocyclic $C_{6-30}$ aryl group bearing a hydroxyl group attached thereto through a single bond or an unsubstituted or substituted $C_1$-$C_{30}$ linking group optionally including at least one heteroatom selected from O, S, N, and P, and z is 2 or 3, wherein when Y is I, z is 2, or when Y is S, z is 3.

13. The coated substrate of claim 12, wherein G⁺ is represented by Formula 2:

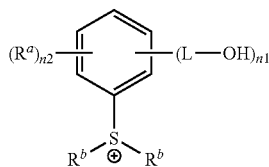

Formula 2 wherein, in Formula 2, each $R^a$ is independently hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, each $R^b$ is a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein groups $R^b$ are optionally attached to each other by a single bond or a linking group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH₂— group is optionally replaced by —SO₂—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

n1 is an integer from 1 to 5, and n2 is an integer from 0 to 4, provided that the sum of n1 and n2 does not exceed 5.

14. The coated substrate of claim 12, wherein G⁺ is represented by Formula 3:

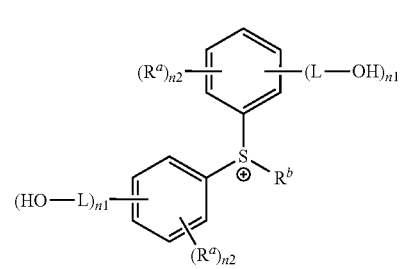

Formula 3 wherein, in Formula 3, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, wherein groups $R^a$ are optionally attached to each other by a single bond or a linking group, $R^b$ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH₂— group is optionally replaced by —SO₂-, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5, each n2 is an integer from 0 to 4, and provided that each sum of n1 and n2 does not exceed 5.

15. The coated substrate of claim 12, wherein G⁺ is represented by Formula 4:

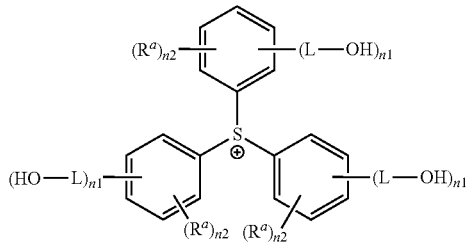

Formula 4 wherein, in Formula 4, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —CH$_2$— group is optionally replaced by —SO$_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5, each n2 is an integer from 0 to 4, and provided that each sum of n1 and n2 does not exceed 5.

16. The coated substrate of claim 12, wherein the cyanurate structural unit is derived from a compound represented by Formula 5:

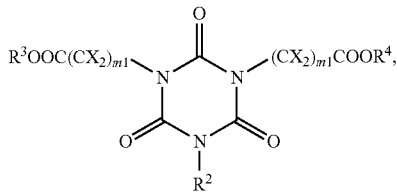

Formula 5 wherein, in Formula 5, $R^2$, $R^3$, $R^4$, and each X are independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfinyl group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and each m1 is independently an integer of 1 to 10.

17. The coated substrate of claim 12, wherein the cyanurate structural unit is derived from a compound represented by Formula 6:

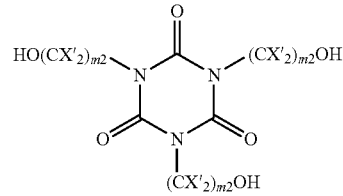

Formula 6 wherein, in Formula 6, each X' is independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfinyl group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and each m2 is independently an integer of 1 to 10.

18. The coated substrate of claim 12, wherein the compound capable of crosslinking the photoacid generator and the polymer is represented by Formula 7:

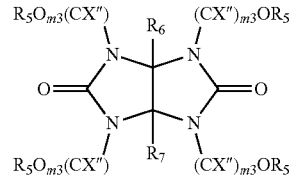

Formula 7 wherein, in Formula 7, each X', each X", each $R^5$, $R^6$, and $R^7$ are independently hydrogen, a halogen, a hydroxyl group, a substituted or unsubstituted $C_{1-30}$ alkyl group, a substituted or unsubstituted $C_1$-$C_{30}$ alkoxy group, a substituted or unsubstituted $C_3$-$C_{30}$ cycloalkyl group, a substituted or unsubstituted $C_7$-$C_{30}$ arylalkyl group, and each m2 and each m3 are independently an integer of 2 to 10.

19. The method of claim 10, wherein the thermal acid generator comprises a benzenesulfonic acid generator represented by Formula 9:

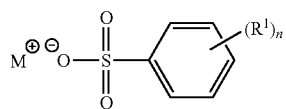
(9)

wherein,
each R¹ is independently hydroxyl, cyano, halogen, amino, optionally substituted alkyl, optionally substituted heteroalkyl, optionally substituted carbocyclic, or optionally substituted heteroaryl; and
n is an integer from 0 to 5; and
M⁺ is a cation.

20. The coated substrate of claim 12, wherein the thermal acid generator comprises a benzenesulfonic acid generator represented by Formula 9:

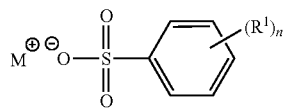
(9)

wherein,
each R¹ is independently hydroxyl, cyano, halogen, amino, optionally substituted alkyl, optionally substituted heteroalkyl, optionally substituted carbocyclic, or optionally substituted heteroaryl; and
n is an integer from 0 to 5; and
M⁺ is a cation.

21. The coated substrate of claim 12, wherein the thermal acid generator comprises a pyridinium acid generator represented by Formula 10:

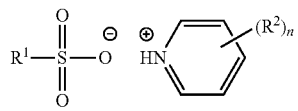
(10)

wherein,
R¹ is optionally substituted alkyl, optionally substituted heteroalkyl, optionally substituted carbocyclic, or optionally substituted heteroaryl;
each R² is independently hydroxyl, cyano, halogen, amino, optionally substituted alkyl, optionally substituted heteroalkyl, optionally substituted carbocyclic, or optionally substituted heteroaryl; and
n is an integer from 0 to 5.

22. The coated substrate of claim 12, wherein the cyanurate structural unit comprises
a first nitrogen ring atom substituted with a first carboxy group of formula —COOR$^a$, wherein R$^a$ is hydrogen or $C_{1-12}$ alkyl, and
a second nitrogen ring atom substituted with a second carboxy group of formula —COOR$^b$, wherein R$^b$ is hydrogen or $C_{1-12}$ alkyl,
provided that the first carboxy group is different from the second carboxy group.

23. A method of forming a pattern, comprising: (a) applying a layer of the antireflective coating composition over a substrate; (b) curing the applied antireflective coating composition to form an antireflective layer; (c) forming a photoresist layer over the antireflective layer; and (d) patterning the photoresist layer and transferring the pattern from the patterned photoresist layer to the antireflective layer,
wherein the antireflective coating composition comprises:
a polymer, wherein the polymer comprises a cyanurate structural unit,
a photoacid generator comprising a crosslinkable group,
a compound capable of crosslinking the polymer and the photoacid generator,
a thermal acid generator, and
an organic solvent,
wherein the photoacid generator is an onium salt having formula G⁺A⁻ wherein G⁺ has Formula 1 and A⁻ is a non-polymerizable organic anion:

Formula 1

wherein, in Formula 1,
Y is I or S,
each R¹ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein when Y is S, one of the R¹ is optionally attached to one adjacent R¹ by a single bond or a linking group,
provided that at least one R¹ is a monocyclic $C_{6-30}$ aryl group bearing a hydroxyl group attached thereto through a single bond or an unsubstituted or substituted $C_1$-$C_{30}$ linking group optionally including at least one heteroatom selected from O, S, N, and P, and
z is 2 or 3, wherein when Y is I, z is 2, or when Y is S, z is 3.

24. The method of claim 23, wherein the patterning the photoresist layer and transferring the pattern from the patterned photoresist layer to the antireflective layer comprises: (d)(1) exposing the photoresist layer and the antireflective layer to activating radiation, and (d)(2) developing the exposed photoresist layer and antireflective layer with an organic solvent developer.

25. The method of claim 23, wherein G⁺ is represented by Formula 2:

Formula 2

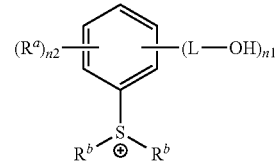

wherein, in Formula 2,
each R$^a$ is independently hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, each $R^b$ is a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, wherein groups $R^b$ are optionally attached to each other by a single bond or a linking group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —$CH_2$— group is optionally replaced by —$SO_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

n1 is an integer from 1 to 5, and
n2 is an integer from 0 to 4,
provided that the sum of n1 and n2 does not exceed 5.

26. The method of claim 23, wherein $G^+$ is represented by Formula 3:

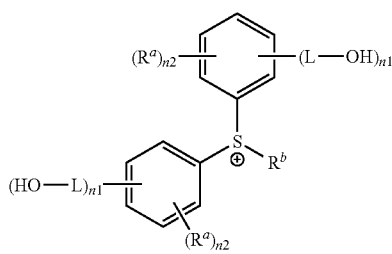

Formula 3 wherein, in Formula 3, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, wherein groups $R^a$ are optionally attached to each other by a single bond or a linking group, $R^b$ is independently a substituted or unsubstituted $C_{1-30}$ alkyl group, a substituted or unsubstituted polycyclic or monocyclic $C_{3-30}$ cycloalkyl group, a substituted or unsubstituted polycyclic or monocyclic $C_{6-30}$ aryl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —$CH_2$— group is optionally replaced by —$SO_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5,
each n2 is an integer from 0 to 4, and
provided that each sum of n1 and n2 does not exceed 5.

27. The method of claim 23, wherein $G^+$ is represented by Formula 4:

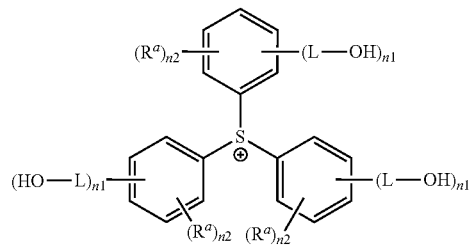

Formula 4 wherein, in Formula 4, each $R^a$ is hydrogen, a halogen, a cyano group, a nitro group, an amino group, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_7$-$C_{30}$ arylalkyl group, each L is a single bond, a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_3$-$C_{30}$ cycloalkenylene group, a substituted or unsubstituted $C_3$-$C_{30}$ cycloalkynylene group, a substituted or unsubstituted $C_6$-$C_{30}$ arylene group, or a substituted or unsubstituted $C_6$-$C_{30}$ heteroarylene group, in each of which groups at least one non-adjacent —$CH_2$— group is optionally replaced by —$SO_2$—, —C(=O)—, —O—, —S—, —SO—, —C(=O)O—, —OC(=O)—, —C(=O)NR—, or —NRC(=O)—, wherein R is hydrogen or a $C_1$-$C_{10}$ alkyl group, or a combination thereof;

each n1 is an integer from 1 to 5,
each n2 is an integer from 0 to 4, and
provided that each sum of n1 and n2 does not exceed 5.

28. The method of claim 23, wherein the cyanurate structural unit is derived from a compound represented by Formula 5:

Formula 5

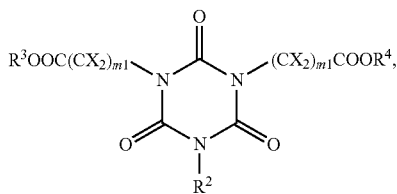

wherein, in Formula 5, $R^2$, $R^3$, $R^4$, and each X are independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfinyl group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and each m1 is independently an integer of 1 to 10.

29. The method of claim 23, wherein the thermal acid generator comprises a pyridinium acid generator represented by Formula 10:

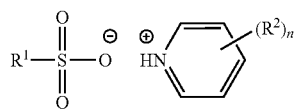

(10)

wherein, $R^1$ is optionally substituted alkyl, optionally substituted heteroalkyl, optionally substituted carbocyclic, or optionally substituted heteroaryl;

each $R^2$ is independently hydroxyl, cyano, halogen, amino, optionally substituted alkyl, optionally substituted heteroalkyl, optionally substituted carbocyclic, or optionally substituted heteroaryl; and n is an integer from 0 to 5.

30. The method of claim 23, wherein $A^-$ is a sulfonate anion.

31. The method of claim 23, wherein the cyanurate structural unit is derived from a compound represented by Formula 6:

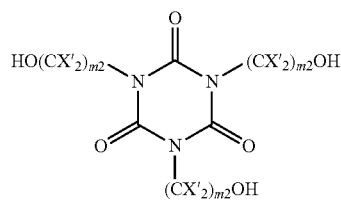

Formula 6 wherein, in Formula 6, each $X^1$ is independently hydrogen, a substituted or unsubstituted $C_{1-30}$ alkyl group, a substituted or unsubstituted $C_{2-30}$ alkenyl group, a substituted or unsubstituted $C_{2-30}$ alkynyl group, a substituted or unsubstituted $C_{2-30}$ alkanoyl group, a substituted or unsubstituted $C_1$-$C_{30}$ alkoxy group, a substituted or unsubstituted $C_1$-$C_{30}$ alkylthio group, a substituted or unsubstituted $C_1$-$C_{30}$ alkylsulfonyl group, —COOH, a substituted or unsubstituted $C_2$-$C_{30}$ alkoxycarbonyl group, a substituted or unsubstituted $C_7$-$C_{30}$ alkylaryl group, a substituted or unsubstituted $C_6$-$C_{30}$ aryl, a substituted or unsubstituted $C_3$-$C_{30}$ heteroalicyclic, or a substituted or unsubstituted $C_3$-$C_{30}$ heteroaromatic group, and each m2 is independently an integer of 1 to 10.

32. The method of claim 23, wherein the cyanurate structural unit comprises
a first nitrogen ring atom substituted with a first carboxy group of formula —COOR$^a$, wherein R$^a$ is hydrogen or $C_{1-12}$ alkyl, and
a second nitrogen ring atom substituted with a second carboxy group of formula —COOR$^b$, wherein R$^b$ is hydrogen or $C_{1-12}$ alkyl,
provided that the first carboxy group is different from the second carboxy group.

* * * * *